(12) United States Patent
Park et al.

(10) Patent No.: US 9,960,194 B1
(45) Date of Patent: May 1, 2018

(54) DISPLAY DEVICE

(71) Applicant: LG DISPLAY CO., LTD., Seoul (KR)

(72) Inventors: DongHyun Park, Seoul (KR);
YoungSeop Lee, Gumi-si (KR);
SeongWook Choi, Gyeongsangbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/412,863

(22) Filed: Jan. 23, 2017

(51) Int. Cl.
| | |
|---|---|
| *H01L 27/14* | (2006.01) |
| *H01L 27/12* | (2006.01) |
| *G09G 3/3208* | (2016.01) |
| *G09G 3/36* | (2006.01) |
| *H01L 29/786* | (2006.01) |
| *G02F 1/1345* | (2006.01) |
| *G02F 1/1362* | (2006.01) |
| *G02F 1/1368* | (2006.01) |
| *H01L 27/32* | (2006.01) |

(52) U.S. Cl.
CPC ......... *H01L 27/124* (2013.01); *G09G 3/3208* (2013.01); *G09G 3/36* (2013.01); *H01L 29/78633* (2013.01); *G02F 1/1368* (2013.01); *G02F 1/13452* (2013.01); *G02F 1/136286* (2013.01); *G09G 2300/0408* (2013.01); *G09G 2300/0426* (2013.01); *G09G 2300/0809* (2013.01); *G09G 2310/0297* (2013.01); *H01L 27/3262* (2013.01); *H01L 27/3272* (2013.01); *H01L 27/3276* (2013.01)

(58) Field of Classification Search
CPC ............. H01L 27/3262; H01L 27/3272; H01L 27/3276; G09G 3/3208; G09G 3/36; G09G 2310/0297; G09G 2300/0408; G09G 2300/0426; G09G 2300/0809; G02F 1/13452; G02F 1/136286; G02F 1/1368
See application file for complete search history.

(56) References Cited

U.S. PATENT DOCUMENTS

| | | | | |
|---|---|---|---|---|
| 9,035,862 | B2 * | 5/2015 | Sato | G09G 3/006 315/169.3 |
| 2005/0117410 | A1 * | 6/2005 | Shin | G09G 3/325 365/189.09 |
| 2005/0134541 | A1 * | 6/2005 | Jang | G09G 3/3688 345/94 |
| 2009/0027694 | A1 * | 1/2009 | Kobayashi | G06F 3/0421 356/622 |

* cited by examiner

*Primary Examiner* — Yosef Gebreyesus
(74) *Attorney, Agent, or Firm* — Dentons US LLP

(57) ABSTRACT

Disclosed is a display device including a data distribution circuit with enhanced electrical characteristic. The display device includes a plurality of demultiplexing circuits including a gap area which is provided between two transistors, which are adjacent to each other along a first horizontal axis direction, of first to nth transistors and provided in a non-rectilinear shape along a second horizontal axis direction. Here, the gap area may have a zigzag shape along the second horizontal axis direction.

25 Claims, 10 Drawing Sheets

DISPLAY DEVICE

CROSS-REFERENCE TO RELATED APPLICATIONS

This application claims the benefit of the Korean Patent Application No. 10-2016-0143948 filed on Oct. 31, 2016, which is hereby incorporated by reference as if fully set forth herein.

BACKGROUND

Field of the Invention

The present invention relates to a display device and a method of manufacturing the same.

Discussion of the Related Art

Display devices are being widely used as the display screens of notebook computers, tablet personal computers (PCs), smartphones, portable display devices, portable information devices, etc., in addition to the display screens of televisions (TVs) and monitors.

A display device typically includes a display panel, and a driving integrated circuit (IC) and a scan driving circuit for driving the display panel. The display panel typically includes a plurality of subpixels which are respectively provided in a plurality of pixel areas defined by a plurality of data lines and a plurality of gate lines, with each subpixel including a thin film transistor (TFT). In this case, at least three adjacent subpixels configure a unit pixel that displays a point of an image.

The driving IC is connected to each of the plurality of data lines through a plurality of data link lines in a one-to-one relationship. The driving IC supplies a data voltage to each of the plurality of data lines. The scan driving circuit is connected to each of the plurality of gate lines through a plurality of gate link lines in a one-to-one relationship. The scan driving circuit supplies a scan signal to each of the plurality of gate lines.

A liquid crystal display (LCD) device is disclosed in Korean Patent Publication No. 10-2010-0073441, in which the number of channels of a driving IC is reduced.

The LCD device according to the related art performs a data time division driving operation using a data distribution circuit which includes a plurality of demultiplexing circuits including a plurality of transistors, thereby reducing the number of the channels of the driving IC.

However, when light is incident on the data distribution circuit in the LCD device, a light current flows in a semiconductor layer of each of the transistors provided in the demultiplexing circuits due to the incident light, and the electrical characteristics and reliability of the data distribution circuit may be compromised due to such a leakage current caused by the incident light. Moreover, if the number of data lines increases in the data distribution circuit as the resolution of the display panel becomes higher, a gap area (or an interval) between adjacent transistors provided in each of the demultiplexing circuits becomes narrower, which may result in a process defect such as a short circuit between the adjacent transistors.

In order to address such problems, if an interval between adjacent transistors in each of the demultiplexing circuits is widened, a size (or a pitch) of each of the demultiplexing circuit becomes larger than that of each of unit pixels, and thus, the size of the data distribution circuit increases, which also may increase the size of the display panel.

SUMMARY

Accordingly, the present invention is directed to provide a display device and a method of manufacturing the same that substantially obviate one or more problems due to limitations and disadvantages of the related art.

An aspect of the present application is directed to providing a data distribution circuit and a display device including the same, with improved electrical characteristics.

Another aspect of the present application is directed to providing a data distribution circuit and a display device including the same, with reduced size thereof.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a display device including a plurality of demultiplexing circuits including a gap area which is provided between two transistors, which are adjacent to each other along a first horizontal axis direction, of first to nth transistors and provided in a non-rectilinear shape along a second horizontal axis direction. Here, the gap area may have a zigzag shape along the second horizontal axis direction.

The display device according to an embodiment of the present application may include a data distribution circuit including the plurality of demultiplexing circuits, a light blocking layer overlapping the data distribution circuit, and a power supply line connected to the light blocking layer.

In the display device according to an embodiment of the present application, the plurality of demultiplexing circuits may each include a gap area provided between two transistors, which are adjacent to each other along the second horizontal axis direction, of the first to nth transistors and provided in a non-rectilinear shape along the second horizontal axis direction.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Figure 1:
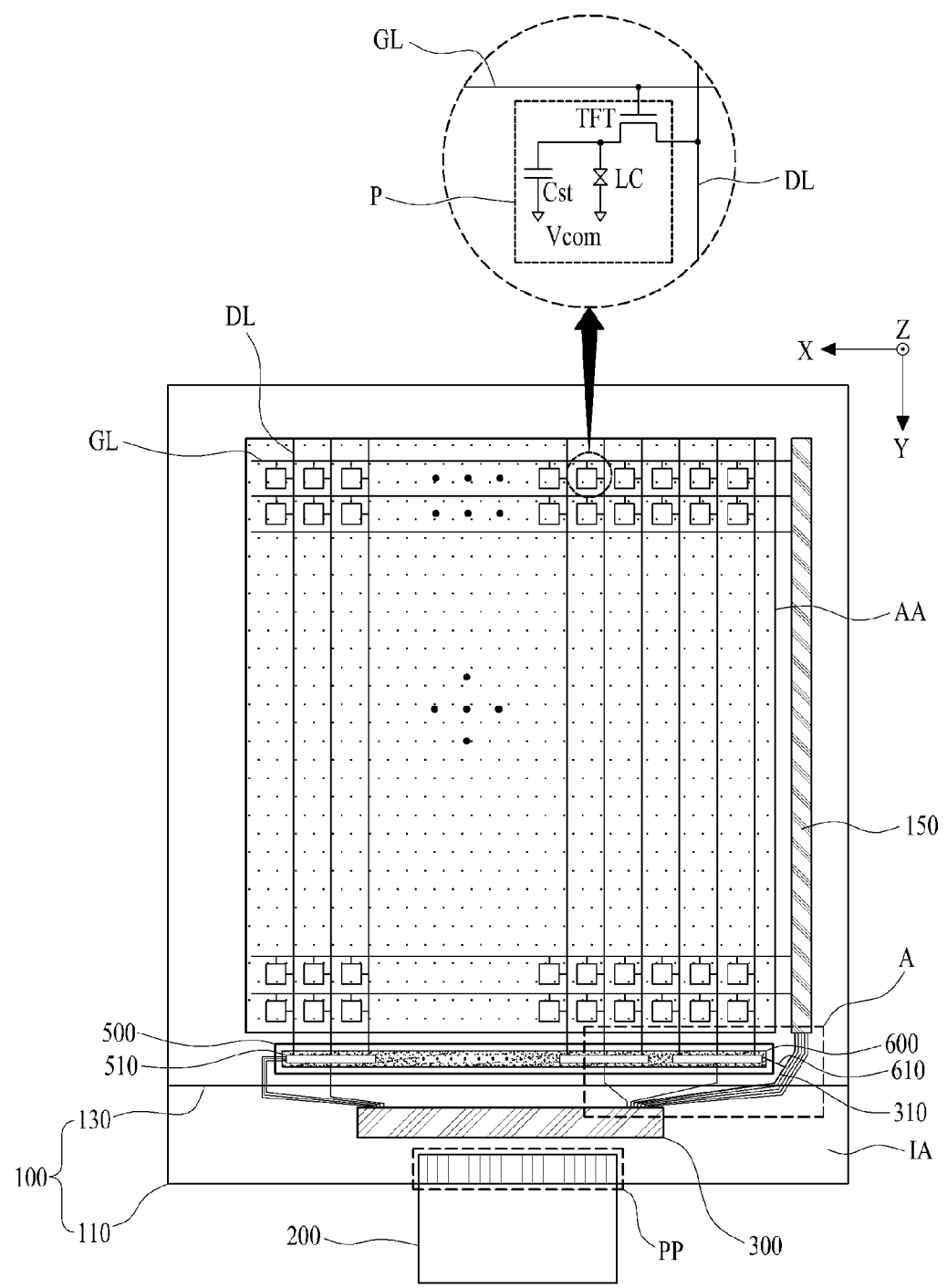
FIG. 1 is a diagram for schematically describing a display device according to an embodiment of the present application.

Reference will now be made in detail to exemplary embodiments of the present invention, examples of which are illustrated in the accompanying drawings. Wherever possible, the same reference numbers will be used throughout the drawings to refer to the same or like parts.

Advantages and features of the present application, and implementation methods thereof will be clarified through following embodiments described with reference to the accompanying drawings. The present application may, however, be embodied in different forms and should not be construed as limited to the embodiments set forth herein. Rather, these embodiments are provided so that this disclosure will be thorough and complete, and will fully convey the scope of the present application to those skilled in the art. Furthermore, the present application is only defined by scopes of claims.

A shape, a size, a ratio, an angle, and a number disclosed in the drawings for describing embodiments of the present application are merely an example, and thus, the present application is not limited to the illustrated details. Like reference numerals refer to like elements throughout. In the following description, when the detailed description of the relevant known technology is determined to unnecessarily obscure the important point of the present application, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present application.

A first horizontal axis direction, a second horizontal axis direction, and a vertical axis direction should not be construed as only a geometric relationship where a relationship therebetween is vertical, and may denote having a broader directionality within a scope where elements of the present application operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present application may be partially or overall coupled to or combined with each other, and may be variously inter-operated with each other and driven technically as those skilled in the art can sufficiently understand. The embodiments of the present application may be carried out independently from each other, or may be carried out together in co-dependent relationship.

Hereinafter, exemplary embodiments of a data distribution circuit for display and a display device including the same according to the present application will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present application, the detailed description will be omitted.

Figure 2:
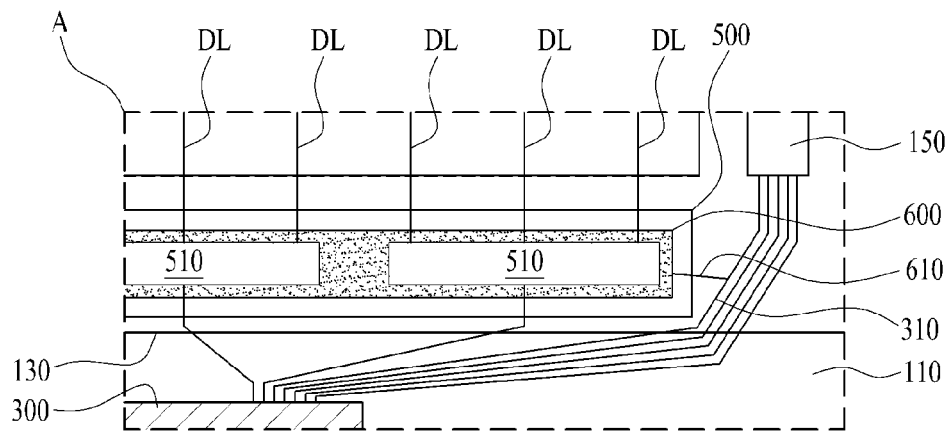
FIG. 2 is an enlarged diagram of portion A illustrated in FIG. 1.
Figure 3:
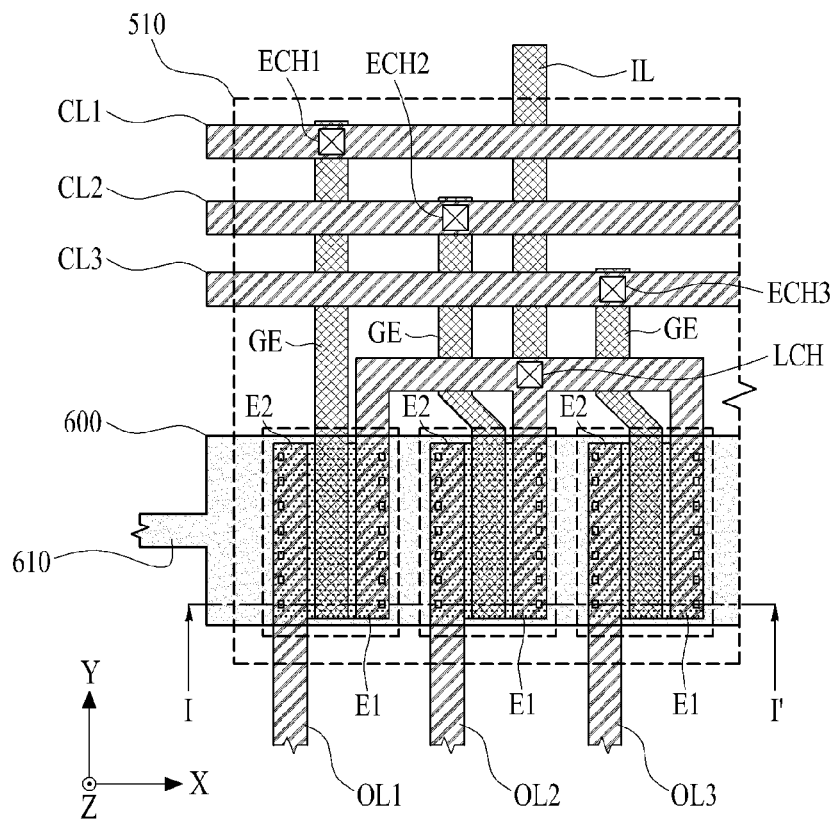
FIG. 3 is a diagram illustrating one of a plurality of demultiplexing circuits illustrated in FIG. 1.
Figure 4:
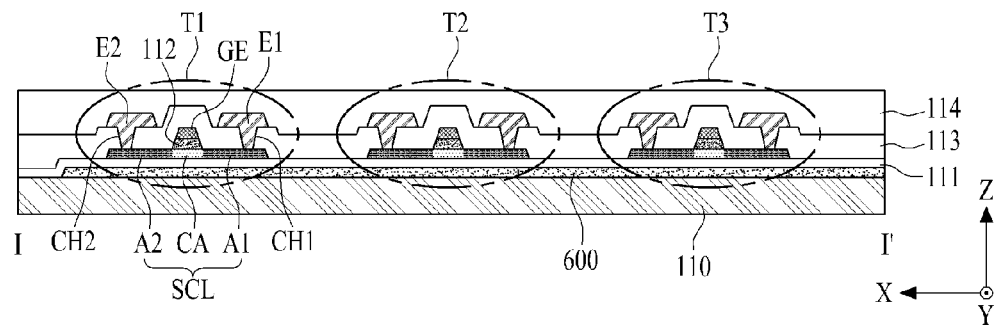
FIG. 4 is a cross-sectional view taken along line I-I' illustrated in FIG. 3.

FIG. 1 is a diagram for schematically describing a display device according to an embodiment of the present application. FIG. 2 is an enlarged diagram of portion A illustrated in FIG. 1. FIG. 3 is a diagram illustrating one of a plurality of demultiplexing circuits illustrated in FIG. 1. FIG. 4 is a cross-sectional view taken along line I-I' illustrated in FIG. 3.

Referring to FIGS. 1 to 4, the display device according to an embodiment may include a display panel 100, a driving IC 300, a data distribution circuit 500, a light blocking layer 600, and a power supply line 610.

The display panel 100 may be a liquid crystal display panel that displays an image by driving liquid crystal molecules and may include a lower substrate 110 and an upper substrate 130 bonded to each other, with a liquid crystal layer therebetween. The display panel 100 may display an image by using the light irradiated from a backlight unit.

The lower substrate 110 may use a glass material or a transparent plastic material (e.g., polyimide, etc.) capable of being bent or curved. In a case where polyimide is used as a material for the lower substrate 110, a polyimide material that can withstand high temperature and has good heat resistance may beneficially be used, because high temperature deposition processes may be performed on the lower substrate 110. The lower substrate 110 may be a thin film transistor (TFT) array substrate and may include a display area AA and a non-display area IA.

The display area AA may be defined as an area except an edge of the lower substrate 110 where an array of pixels is provided for displaying an image.

The non-display area IA may be defined as an area outside the display area AA provided on the lower substrate 110 at an edge of the lower substrate 110 which surrounds the display area AA. The non-display area IA may be a periphery of an outer portion of the display area AA and does not display an image unlike the display area AA. The non-display area IA may be defined as an area where signal lines and circuits for driving the pixel array are provided.

The display area AA may include a plurality of subpixels P respectively provided in a plurality of pixel areas defined by a plurality of gate lines GL and a plurality of data lines DL.

The plurality of gate lines GL may be provided on the lower substrate 110, may extend along a first horizontal axis direction X of the lower substrate 110, and may be arranged at certain intervals along a second horizontal axis direction Y. Here, the first horizontal axis direction X may be defined as a direction parallel to a short side lengthwise direction of the lower substrate 110, and the second horizontal axis direction Y may be defined as a direction parallel to a long side lengthwise direction of the lower substrate 110. However, the directions may be defined as the opposite of the above definition. For example, the first horizontal axis direction X may be a direction parallel to a lengthwise direction of the gate line GL, and the second horizontal axis direction Y may be a direction parallel to a lengthwise direction of the data line DL.

Each of the plurality of subpixels P may be defined as a minimum unit area which actually transmits light. At least three adjacent subpixels P may configure one unit pixel for displaying a color image. For example, one unit pixel may include a red subpixel, a green subpixel, and a blue subpixel which are adjacent to each other, and may further include a white subpixel for enhancing luminance.

Each of the plurality of subpixels P may display an image according to a gate signal supplied from a gate line GL adjacent thereto and a data voltage supplied from a data line DL adjacent thereto. In this case, a corresponding subpixel P may include a thin film transistor TFT connected to the gate line GL and the data line DL which are adjacent thereto, a plurality of pixel electrodes connected to the thin film transistor TFT, and a common electrode provided between the plurality of pixel electrodes.

The lower substrate 110 may further include a pad part PP and a gate-embedded driving circuit 150.

The pad part PP may be connected to an external driving circuit film 200, may receive various signals, a driving power, and a ground power supplied from the driving circuit film 200, and may transfer the received various signals, driving power, and ground power to the driving IC 300. In this case, some of the various signals, the driving power, and the ground power may be directly supplied to the gate-embedded driving circuit 150 without passing through the driving IC 300.

The gate-embedded driving circuit 150 may be provided in a left non-display area and/or a right non-display area of the lower substrate 110 and may be connected to the plurality of gate lines GL in a one-to-one relationship. In this case, the gate-embedded driving circuit 150 may be mounted on the lower substrate 110 by the same process as the thin film transistor TFT. The gate-embedded driving circuit 150 may generate a gate signal based on a gate control signal supplied from the driving IC 300 and may output the gate signal in a predetermined order, thereby turning on the thin film transistor TFT of the subpixel P connected to each of the plurality of gate lines GL. For example, the gate-embedded driving circuit 150 may be configured with a shift register.

The upper substrate 130 may be a color filter array substrate and may have a size smaller than that of the lower substrate 110. The upper substrate 130 according to an embodiment may be formed of a glass or plastic material, and for example, may be formed of the same material as that of the lower substrate 110. The upper substrate 130 according to an embodiment may include a black matrix, a color filter layer, and an overcoat layer.

The black matrix may define an opening area of each of the plurality of subpixels P provided on the lower substrate 110. The black matrix may be provided on the upper substrate 130 to overlap each of the non-display area, the gate lines, the data lines, and the thin film transistor TFT of the lower substrate 110 except a plurality of opening areas respectively overlapping a plurality of pixels. The black matrix is to reduce or prevent light from being leaked in an area other than the plurality of opening areas and absorb external light.

The color filter layer may be provided in each of the plurality of opening areas defined by the black matrix and may include a color filter having one of red, green, and blue corresponding to a color which is set in each subpixel P.

The overcoat layer may cover the black matrix and the color filter layer to provide a planar surface on the black matrix and the color filter layer.

The lower substrate 110 and the upper substrate 130 may be oppositely bonded to each other using a sealant with the liquid crystal layer therebetween. Therefore, the plurality of subpixels P may be arranged in parallel with the liquid crystal layer therebetween, and thus, a liquid crystal cell LC may be provided between the pixel electrode and the common electrode. The liquid crystal cell LC may control transmission of light by driving liquid crystal molecules according to an electric field which is generated by a data voltage supplied to the pixel electrode through the thin film transistor TFT and a common voltage supplied to the common electrode. In this case, each of the plurality of subpixels P may include a storage capacitor Cst provided in an overlapping area of the pixel electrode and the common electrode. The storage capacitor Cst may store a difference voltage between the data voltage supplied to the pixel electrode and the common voltage supplied to the common electrode. When the thin film transistor TFT is turned off, the storage capacitor Cst may supply the stored voltage to the pixel electrode until the thin film transistor TFT is again turned on.

The driving IC 300 may be mounted in a chip mounting area of the lower substrate 110 through a chip bonding process which is performed after a substrate bonding process. The driving IC 300 may be electrically connected to the pad part PP through a plurality of first signal transmission lines, electrically connected to the data distribution circuit 500 through a plurality of second signal transmission lines, and electrically connected to the gate-embedded driving circuit 150 through a plurality of third signal transmission lines.

The driving IC 300 may receive power, a timing synchronization signal, and digital image data supplied from a display driving circuit through the pad part PP and the driving circuit film 200. The driving IC 300 may generate a gate control signal according to the timing synchronization signal to control driving time of the gate-embedded driving circuit 150, and simultaneously, may convert the digital image data into an analog data voltage to supply the analog data voltage to the data distribution circuit 500.

In comparison with the total number of data lines, the number of output channels of the driving IC 300 is reduced through data time division driving, and thus, a size of the driving IC 300 is reduced.

To this end, the driving IC 300 according to an embodiment may temporally divide one horizontal period into first to nth (where n is a natural number equal to or more than two) sub-periods, and may generate and output a data voltage, a gate control signal, and a plurality of data distribution control signals corresponding to each of the first to nth sub-periods obtained through the time division. At this time, the gate-embedded driving circuit 150 may sequentially supply the gate signal synchronized with each of the first to nth sub-periods to a corresponding gate line GL, based on the gate control signal supplied from the driving IC 300. In this manner, the number of data output channels of the driving IC 300 decreases by 1/n of the total number of data lines when one horizontal period is divided into the first to nth sub-periods.

The data distribution circuit 500 may sequentially distribute data voltages, which are sequentially input from the driving IC 300 at every sub-period of one horizontal period, to n number of data lines corresponding to the number of n sub-periods during one horizontal period. The data distribution circuit 500 according to an embodiment may include a plurality of demultiplexing circuits 510.

Each of the plurality of demultiplexing circuits 510 may be connected to a plurality of data groups including n number of data lines in a one-to-one relationship and may sequentially distribute data voltages, which are sequentially input from the driving IC 300, to the n data lines included in each of the data groups according to a plurality of data distribution control signals supplied from the driving IC 300. For convenience of description, it is assumed in the following description that n is three, and that one horizontal period is divided into first sub-period to third sub-period for a time-divisional driving by way of example.

Each of the plurality of demultiplexing circuits 510 according to an embodiment may include one input line IL, first to third output lines OL1 to OL3, first to third control lines CL1 to CL3, and first to third transistors T1 to T3.

The one input line IL may be an input channel of each of the demultiplexing circuits 510 and may receive data voltages sequentially supplied from the driving IC 300 in a time division manner. That is, the one input line IL may be electrically connected to one data output channel, provided in the driving IC 300, through one second signal transmission line.

Each of the first to third output lines OL1 to OL3 may be an output channel of each of the demultiplexing circuits 510 and may output a data voltage, output from the first to third transistors T1 to T3, to a corresponding data line. That is, the first to third output lines OL1 to OL3 may be connected to first to third data lines through a data link line in a one-to-one relationship.

Each of the first to third control lines CL1 to CL3 is for supplying the data distribution control signal supplied from the driving IC 300, for a time-divisional driving of the demultiplexing circuits 510. The first to third control lines CL1 to CL3 may extend along the first horizontal axis direction X and may be arranged at certain intervals on the lower substrate 110 along the second horizontal axis direction Y. Here, each of the first to third control lines CL1 to CL3 may be provided to cross the input line IL. To this end, each of the first to third control lines CL1 to CL3 may be provided on a layer different from the input line IL.

Each of the first to third transistors T1 to T3 may be turned on by a corresponding data distribution control signal, and thus, may be synchronized with the corresponding data distribution control signal to sequentially output a data voltage, supplied to the input line IL, to the first to third output lines OL1 to OL3. Each of the first to third transistors T1 to T3 may be provided in a data distribution circuit area, provided between the chip mounting area and the display area AA on the lower substrate 110, by the same process as the thin film transistor TFT included in a corresponding subpixel P.

Each of the first to third transistors T1 to T3 according to an embodiment may be provided on a buffer layer 111 coated on a top of the lower substrate 110. Here, the buffer layer 111 is to reduce or prevent materials included in the lower substrate 110 from being diffused into the thin film transistors during high temperature processes of manufacturing a TFT. Also, if the display device according to an embodiment of the present application is an organic light emitting display device, the buffer layer 111 may reduce or prevent external water or moisture from penetrating into the organic light emitting display device. The buffer layer 111 may be formed of an insulating material such as silicon oxide (SiOx), silicon nitride (SiNx), and/or the like. Optionally, the buffer layer 111 may be omitted as desired.

Each of the first to third transistors T1 to T3 according to an embodiment may include a semiconductor layer SCL, a gate electrode GE, a first electrode E1, and a second electrode E2.

The semiconductor layer SCL may be provided in an island shape on the lower substrate 110, or may be provided in an island shape on a top of the buffer layer 111 formed on the top of the lower substrate 110. The semiconductor layer SCL according to an embodiment may have a size relatively larger than that of the thin film transistor TFT provided in each subpixel P, in order for the first to third transistors T1 to T3 to have a relatively high voltage output characteristic. In this case, the semiconductor layer SCL may be provided in a rectangular shape which includes a short side equal to or less than a pitch of each subpixel P and a long side which extends in parallel with the second horizontal axis direction Y. Here, with respect to the first horizontal axis direction X, if the short side of the semiconductor layer SCL is greater than the pitch of each subpixel P, a total length of the data distribution circuit 500 is greater than a short side length of the display area AA, and thus, a size of a short side of the lower substrate 110 increases, which may also increase a bezel width of the display device. Accordingly, the short side of the semiconductor layer SCL may have a length less than the pitch of each subpixel P.

The semiconductor layer SCL according to an embodiment may be formed of a semiconductor material such as low temperature poly silicon, amorphous silicon, polycrystalline silicon, oxide, or an organic material, but the present invention is not limited thereto.

The semiconductor layer SCL may include a first area A1 and a second area A2, which become conductive by a dry etching gas during a dry etching process of a gate insulation layer 112, which will be described below, and a channel area CA which does not become conductive. In this case, the first area A1 and the second area A2 may be spaced apart from each other and may be provided in parallel with the channel area CA therebetween. Here, each of first area A1 and the second area A2 may become a source area or a drain area according to a direction of current. Therefore, one of the first area A1 and the second area A2 may be defined as a source area, and the other one area may be defined as a drain area.

The channel area CA of the semiconductor layer SCL may be covered by the gate insulation layer 112. That is, the gate insulation layer 112 may not be provided all over the top of the lower substrate 110 including the semiconductor layer SCL, and may be provided in only the channel area CA of the semiconductor layer SCL.

The gate electrode GE may be provided on the gate insulation layer 112 to overlap the channel area CA of the semiconductor layer SCL. The gate electrode GE may act as a mask to reduce or prevent the channel area CA of the semiconductor layer SCL from becoming conductive by a dry etching gas during a dry etching process (or a patterning process) of the gate insulation layer 112. The gate electrode GE may be formed of molybdenum (Mo), aluminum (Al), chromium (Cr), gold (Au), titanium (Ti), nickel (Ni), neodymium (Nd), copper (Cu), or an alloy thereof, or may be formed of a single layer or multiple layers including two or more metal or metal alloy layers.

The gate electrode GE and the first and second areas A1 and A2 of the semiconductor layer SCL may each be covered by an interlayer insulation layer 113. That is, the interlayer insulation layer 113 may be provided on the lower substrate 110 to cover all of the gate electrode GE and the first and second areas A1 and A2 of the semiconductor layer SCL. The interlayer insulation layer 113 according to an embodiment may be formed of an insulating material such as SiOx, SiNx, photo acryl, benzocyclobutene (BCB), or the like.

The first electrode E1 may be provided on the interlayer insulation layer 113 to overlap the first area A1 of the semiconductor layer SCL and may be electrically connected to the first area A1 of the semiconductor layer SCL. That is, the first electrode E1 may be electrically connected to the first area A1 of the semiconductor layer SCL through a plurality of first contact holes CH1 which are provided in the interlayer insulation layer 113 to overlap the first area A1 of the semiconductor layer SCL.

The second electrode E2 may be provided on the interlayer insulation layer 113 to overlap the second area A2 of the semiconductor layer SCL and may be electrically connected to the second area A2 of the semiconductor layer SCL. That is, the second electrode E2 may be electrically connected to the second area A2 of the semiconductor layer SCL through a plurality of second contact holes CH2 which are provided in the interlayer insulation layer 113 to overlap the second area A2 of the semiconductor layer SCL.

The first and second electrodes E1 and E2 may be simultaneously formed of the same material. For example, each of the first and second electrodes E1 and E2 may be formed of molybdenum (Mo), aluminum (Al), chromium (Cr), gold (Au), titanium (Ti), nickel (Ni), neodymium (Nd), copper (Cu), or an alloy thereof, or may be formed of a single layer or multiple layers including two or more metal or metal alloy layers.

The first and second electrodes E1 and E2 may be covered by a passivation layer 114. That is, the passivation layer 114 may be provided on the lower substrate 110 to cover the first and second electrodes E1 and E2, thereby protecting transistors from an external impact and/or the like. The passivation layer 114 according to an embodiment may be formed of an insulating material such as SiOx, SiNx, photo acryl, BCB, or the like.

In each of the first to third transistors T1 to T3, the gate electrode GE may extend in the second horizontal axis direction Y to cross the first to third control lines CL1 to CL3 and may be connected to a corresponding control line of the control lines CL1 to CL3 through each of first to third electrode contact holes ECH1 to ECH3 in a one-to-one relationship.

Moreover, in each of the first to third transistors T1 to T3, one (e.g., a source electrode) of the first and second electrodes E1 and E2 may be connected to the input line IL in common, and the other electrode (e.g., a drain electrode) of the first and second electrodes E1 and E2 may be connected to the first to third output lines OL1 to OL3 in a one-to-one relationship. In this case, the input line IL may be provided along with the gate electrode GE and may be connected to one (e.g., the source electrode) of the first and second electrodes E1 and E2 of each of the first to third transistors T1 to T3 in common. Hereinafter, it is assumed by way of example that the first electrode E1 of each of the first to third transistors T1 to T3 is connected to the input line IL in common, and the second electrode E2 of each of the first to third transistors T1 to T3 is connected to the first to third output lines OL1 to OL3 in a one-to-one relationship.

Each of the first to third transistors T1 to T3 may be sequentially turned on by first to third data distribution control signals, which are sequentially supplied to the first to third control lines CL1 to CL3 in a time division manner, and may sequentially output data voltages, supplied from the driving IC 300 through the input line IL, to the first to third output lines OL1 to OL3 in synchronization with the first to third data distribution control signals.

The light blocking layer 600 according to an embodiment may be provided on the lower substrate 110 to overlap the data distribution circuit 500. The light blocking layer 600 is to reduce or prevent light from being irradiated onto the transistors T1 to T3 provided in the data distribution circuit 500. That is, the light blocking layer 600 may be provided on the lower substrate 110 to overlap the transistors T1 to T3 provided in the data distribution circuit 500, and may reduce or prevent the light emitted from a backlight unit from being incident on the transistors T1 to T3. Accordingly, the light blocking layer 600 may reduce or prevent electrical characteristics of the demultiplexing circuits 510 from being degraded due to a leakage current of each of the transistors T1 to T3 which may be caused by light incident on each of the demultiplexing circuits 510 of the data distribution circuit 500.

The light blocking layer 600 according to an embodiment may be provided on the lower substrate 110 and may be disposed under the semiconductor layer SCL of each of the transistors T1 to T3. That is, the light blocking layer 600 may be directly provided on the top of the lower substrate 110 to overlap each of the demultiplexing circuits 510 of the data distribution circuit 500 and may be covered by the buffer layer 111.

The light blocking layer 600 according to an embodiment may include a material (e.g., a metal material, a semiconductor material, or the like) which absorbs or reflects incident light and has a conductivity.

The light blocking layer 600 may include a metal material such as Cu, Mo, Ti, Mo/Ti, or chromium (Cr).

The light blocking layer 600 including a metal material may be provided in a three-layer structure including a first oxide layer, a metal layer, and a second oxide layer. The first and second oxide layers may be formed of the same oxide or different oxides and may include zinc (Zn), indium (In), or tin (Sn)-based oxide. The metal layer may include one of Cu, Mo, Ti, Mo/Ti, and Cr.

The light blocking layer 600 may also include a semiconductor material such as amorphous Si, amorphous Ge, copper oxide, oxide, an organic material, and/or the like.

The light blocking layer 600 including a semiconductor material may include amorphous silicon with impurities doped thereon, an oxide semiconductor having conductivity, and polycrystalline silicon with impurities doped thereon, to enhance conductivity.

The power supply line 610 according to an embodiment may be electrically connected to the light blocking layer 600 and may supply a certain voltage to the light blocking layer 600.

For example, the power supply line 610 may extend from the light blocking layer 600 and may be connected to a ground line 310 to ground the light blocking layer 600. Here, the power supply line 610 may be electrically connected to the ground line 310 between a ground channel provided in the driving IC 300 and the gate-embedded driving circuit 150.

The power supply line 610 may extend from the light blocking layer 600 and may be directly connected to the ground channel provided in the driving IC 300.

The power supply line 610 may also extend from the light blocking layer 600 and may be electrically connected to a ground line provided on the lower substrate 110 to surround the display area AA of the lower substrate 110.

The power supply line 610 may also extend from the light blocking layer 600 and may be electrically connected to a direct current (DC) voltage line provided on the lower substrate 110, thereby supplying a DC voltage, supplied through the DC voltage line, to the light blocking layer 600.

The power supply line 610 may electrically ground the light blocking layer 600 or may supply a DC voltage to the light blocking layer 600, thereby reducing or preventing electrical characteristics of the transistors T1 to T3 from being changed when the light blocking layer 600 overlaps the transistors T1 to T3 of each of the demultiplexing circuits.

In detail, the light blocking layer 600 may be provided to overlap the transistors T1 to T3 to reduce or prevent light from being incident on the transistors T1 to T3 of each of the demultiplexing circuits, and thus, a parasitic capacitor may be formed between the light blocking layer 600 and the semiconductor layer SCL of each of the transistors T1 to T3. Electric charges may be accumulated into the parasitic capacitor by a voltage applied to each of the transistors T1 to T3. At this time, when the light blocking layer 600 is electrically floated, a threshold voltage of each of the transistors T1 to T3 may vary due to a deviation of electrical charges accumulated into each of parasitic capacitors formed between the transistors T1 to T3 and the light blocking layer 600.

As a result, the light blocking layer 600 according to an embodiment may be electrically grounded or may be supplied with a DC voltage so that electrical charges are not accumulated or constant electrical charges are accumulated into each of the parasitic capacitors formed between the transistors T1 to T3 and the light blocking layer 600, and thus, the threshold voltage of each of the transistors T1 to T3 is reduced or prevented from varying due to a deviation of electrical charges accumulated into each of parasitic capacitors formed between the transistors T1 to T3 and the light blocking layer 600. Accordingly, the reliability of the transistors T1 to T3 may be enhanced, thereby enhancing electrical characteristics of the demultiplexing circuits 510 and/or the data distribution circuit 500.

Figure 5:
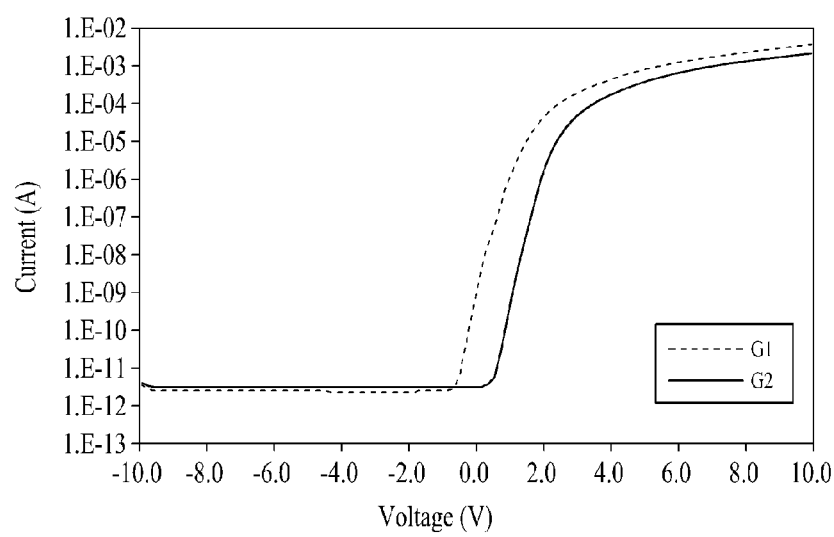
FIG. 5 is a graph showing a voltage-current characteristic of a transistor provided in a data distribution circuit according to an embodiment and a comparative example.

FIG. 5 is a graph showing a voltage-current characteristic of a transistor provided in a data distribution circuit according to an embodiment of the present invention and a comparative example. FIG. 5 shows a result obtained by measuring a voltage-current characteristic of a transistor in a state where the light blocking layer overlapping the transistor is electrically grounded. The comparative example in FIG. 5 shows a result obtained by measuring a voltage-current characteristic of a transistor in a state where the light blocking layer overlapping the transistor is electrically floated.

As shown in graph G1 of FIG. 5, in the comparative example, it can be seen that when the light blocking layer is electrically floated, due to electric charges accumulated into a parasitic capacitor formed between the transistor and the light blocking layer, a threshold voltage of the transistor is shifted in a negative polar direction, and the threshold voltage of the transistor is increased.

On the other hand, as shown in graph G2 of FIG. 5, in the present embodiment, it can be seen that when the light blocking layer is electrically grounded, electrical charges are not accumulated or constant electrical charges are accumulated into the parasitic capacitor formed between the transistor and the light blocking layer, and thus, a threshold voltage of the transistor is not shifted as much as the comparative example. Since the light blocking layer 600 is provided to overlap the transistors T1 to T3 of each of the demultiplexing circuits and the light blocking layer 600 is electrically grounded or is supplied with a DC voltage, incident light can be blocked, and moreover, the electrical characteristics of the transistors T1 to T3 can be reduced or prevented from being changed which was caused by a parasitic capacitor formed by the floated light blocking layer 600 in the comparative example.

The present embodiment has been described that the light blocking layer 600 is provided on the lower substrate 110 as one body to overlap the data distribution circuit 500, but the present embodiment is not limited thereto. In other embodiments, the light blocking layer 600 may include a plurality of light blocking patterns which individually overlap each transistor provided in each of the plurality of demultiplexing circuits 510, and each of the plurality of light blocking patterns may be individually and electrically connected to a ground line or a DC voltage line through each of the plurality of power supply lines.

Optionally, each of the plurality of light blocking patterns may be electrically connected to an electrode, connected to the input line IL, of the first and second electrodes E1 and E2 of a corresponding transistor. In this case, since each of the plurality of light blocking patterns has the same electric potential as that of the electrode of the corresponding transistor connected to the input line IL, the characteristic of transistors may not be changed by a parasitic capacitor formed by each of the light blocking patterns.

In the display device according to an embodiment of the present application, since an image is displayed through a data time division driving operation using the data distribution circuit 500, the number of channels of the driving IC 300 can be reduced. Moreover, since light incident on the data distribution circuit 500 can be blocked by the light blocking layer 600, the electrical characteristics of the data distribution circuit 500 may not be changed by the light. Also, since the light blocking layer 600 is electrically grounded or is maintained at a certain electric potential, the electrical characteristics of the data distribution circuit 500 are reduced or prevented from being changed by a parasitic capacitor formed by the light blocking layer 600.

Figure 6:
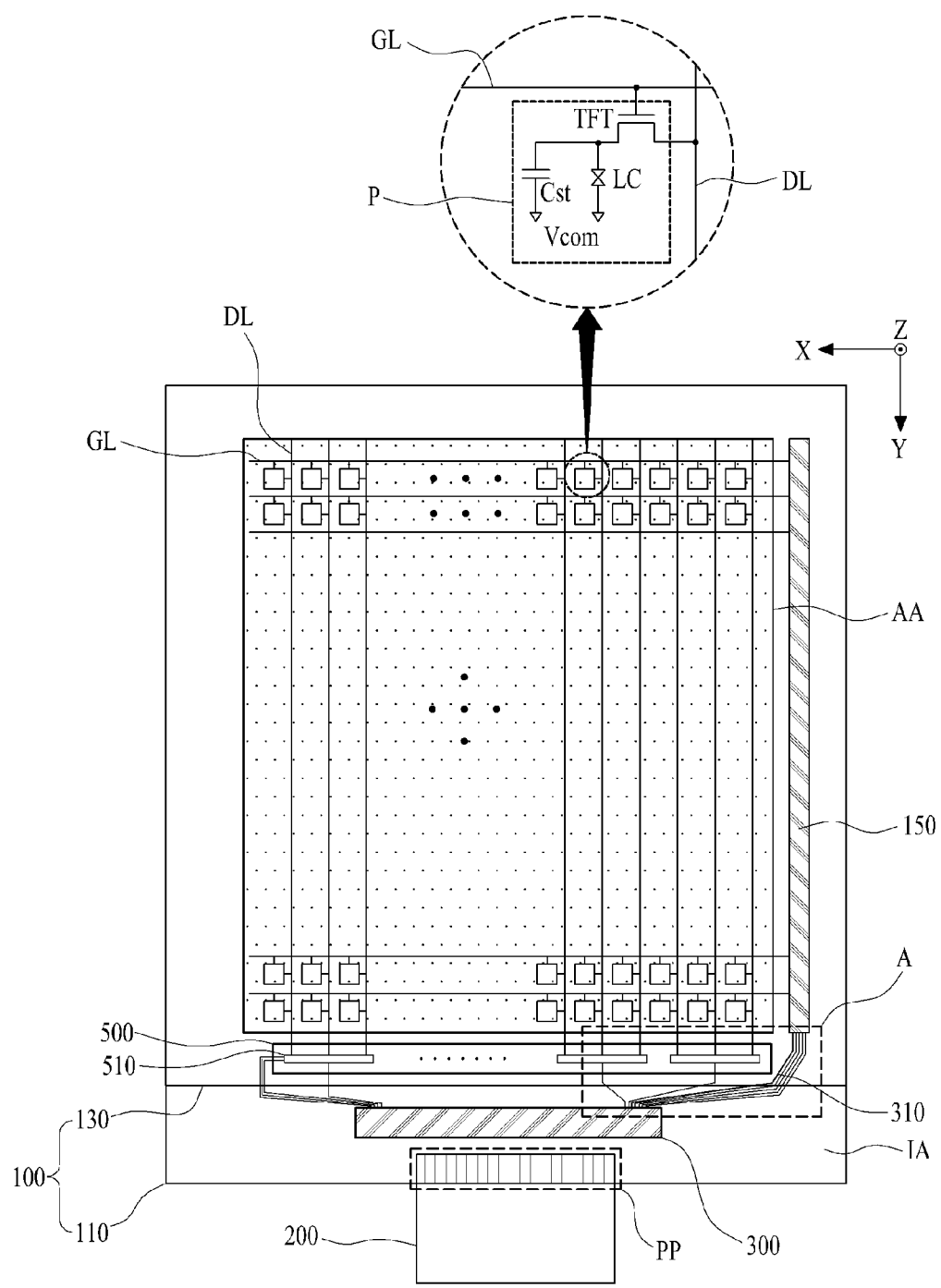
FIG. 6 is a diagram for schematically describing a display device according to an embodiment of the present application.
Figure 7:
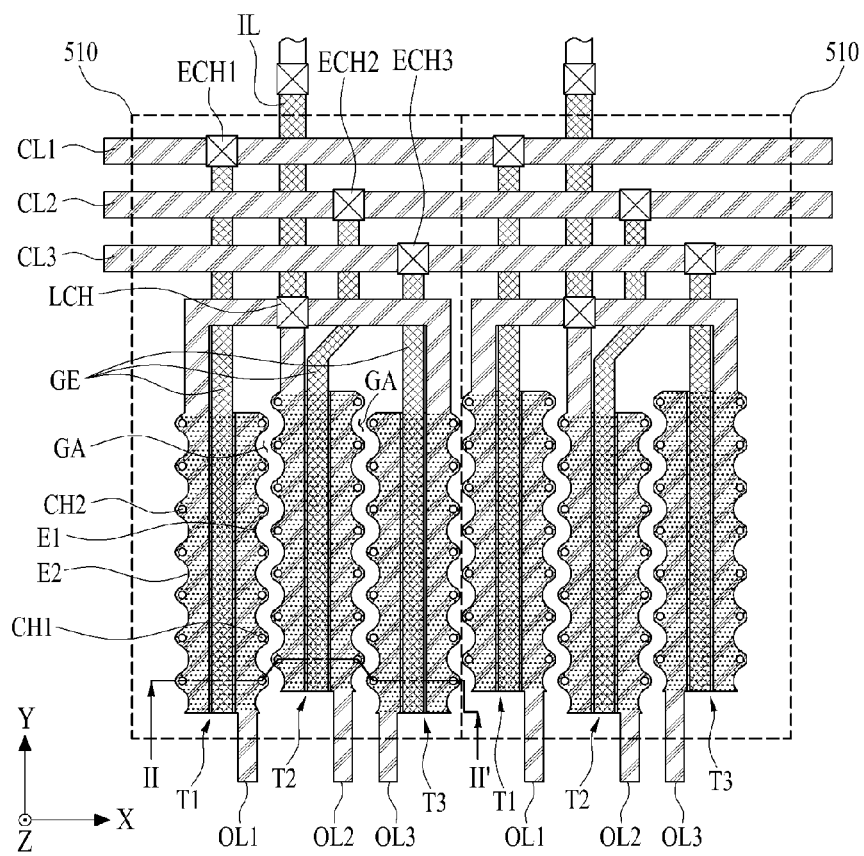
FIG. 7 is a diagram illustrating a portion of each of a plurality of demultiplexing circuits included in a data distribution circuit illustrated in FIG. 6.
Figure 8:
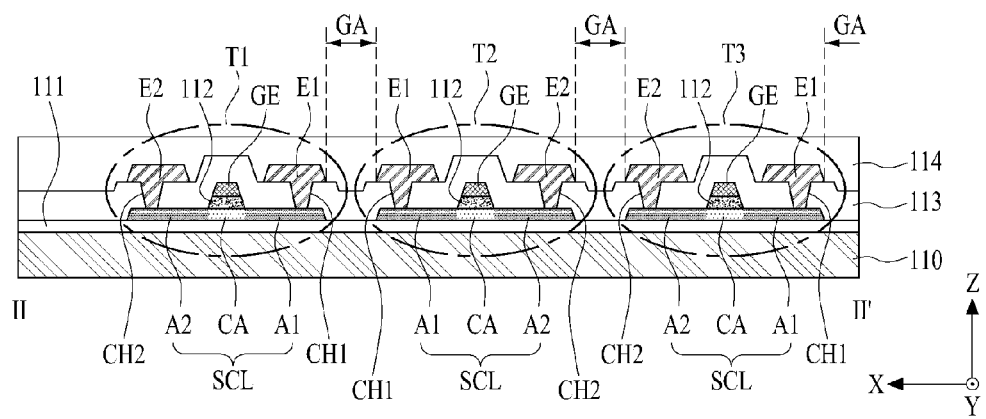
FIG. 8 is a cross-sectional view taken along line II-II' illustrated in FIG. 7.
Figure 9:
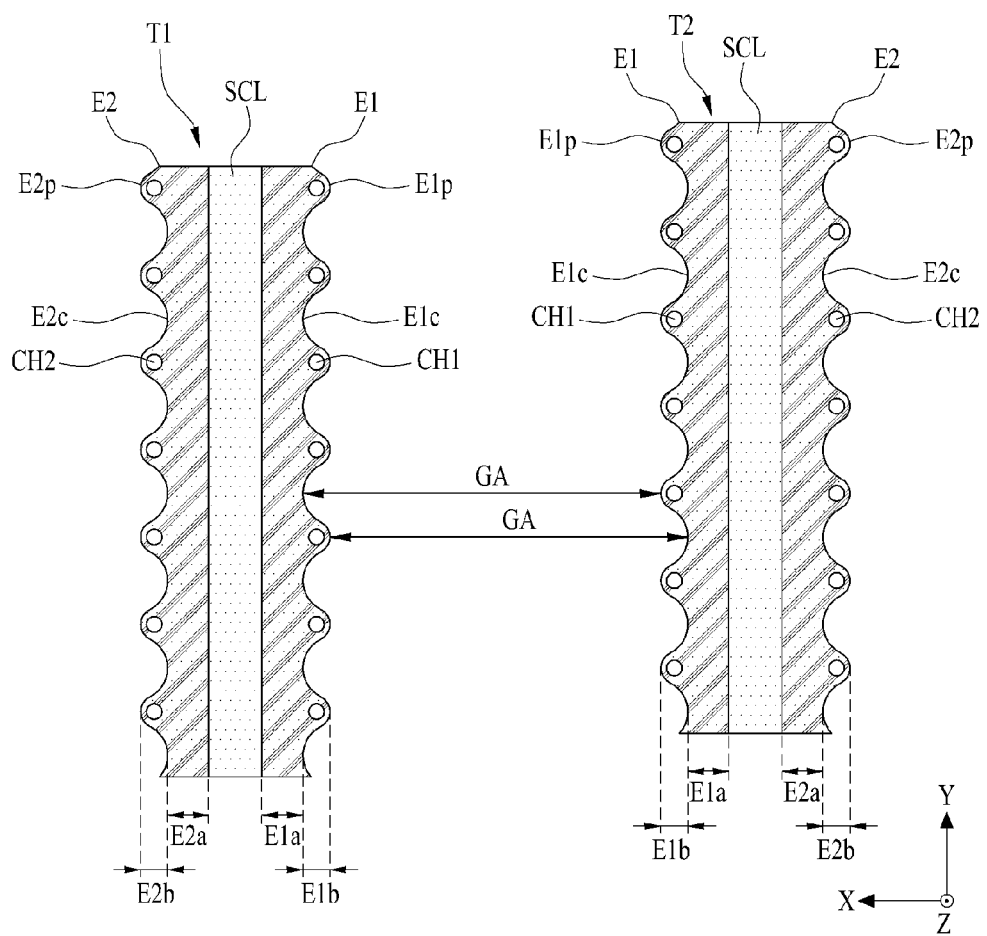
FIG. 9 is a diagram for describing a structure of each of first and second electrodes included in a transistor illustrated in FIG. 7.

FIG. 6 is a diagram for schematically describing a display device according to an embodiment of the present application. FIG. 7 is a diagram illustrating a portion of each of a plurality of demultiplexing circuits included in a data distribution circuit illustrated in FIG. 6. FIG. 8 is a cross-sectional view taken along line II-II' illustrated in FIG. 7. FIG. 9 is a diagram for describing a structure of each of first and second electrodes included in a transistor illustrated in FIG. 7. The display device is implemented by modifying the plurality of demultiplexing circuits of the display device illustrated in FIGS. 1 to 4.

Referring to FIGS. 6 to 9, the display device according to an embodiment of the present application may be implemented by modifying a structure of a transistor provided in each of a plurality of demultiplexing circuits 510, which are provided in a data distribution circuit applied to a display panel having a high resolution.

The display device according to an embodiment may include a display panel 100, a driving IC 300, and a data distribution circuit 500.

The display panel 100 and the driving IC 300 are the same as the display panel and the driving IC of the display device illustrated in FIGS. 1 to 4, and thus, their repetitive descriptions will be omitted.

The data distribution circuit 500 according to an embodiment may sequentially distribute data voltages, which are sequentially input from the driving IC 300 at every sub-period of one horizontal period, to n number of data lines corresponding to the number of n sub-periods during one horizontal period. For convenience of description, it is assumed in the following description that n is three, and that one horizontal period is divided into first sub-period to third sub-period for a time-divisional driving by way of example.

The data distribution circuit 500 according to an embodiment may include a plurality of demultiplexing circuits 510.

Each of the plurality of demultiplexing circuits 510 according to an embodiment may include one input line IL, first to third output lines OL1 to OL3, and first to third transistors T1 to T3 which are connected to the input line IL in common and are connected to the first to third output lines OL1 to OL3 in a one-to-one relationship.

Each of the first to third transistors T1 to T3 may include a semiconductor layer SCL, a gate electrode GE, a first electrode E1, and a second electrode E2 which are provided in a data distribution circuit area defined by a lower substrate 110. Except that the semiconductor layer SCL is provided on a top of a buffer layer 111 formed on a top of the lower substrate 110 and a structure of each of the first and second electrodes E1 and E2 is changed, the first to third transistors T1 to T3 are the same as the first to third transistors illustrated in FIGS. 2 and 4. Hereinafter, only the first and second electrodes E1 and E2 of each of the first to third transistors T1 to T3 will thus be described.

A gap area GA may be provided between two transistors T1 and T2 (or T2 and T3), which are adjacent to each other along a first horizontal axis direction X, of the first to third transistors T1 to T3, and may have a non-rectilinear shape along a second horizontal axis direction Y. Here, the non-rectilinear shape may be defined as a shape having a path which is greater than a shortest path (or a rectilinear path) from one end of the semiconductor layer SCL, which is adjacent to the input line IL, to the other end of the semiconductor layer SCL adjacent to an output line OL, with respect to a lengthwise direction of the gap area GA or the second horizontal axis direction Y. For example, the gap area GA having the non-rectilinear shape may be defined as a zigzag shape, a wave shape, or an S-shape along the second horizontal axis direction Y.

With respect to the first horizontal axis direction X, a width of the gap area GA according to the present embodiment may be set to 2 μm to 4 μm. Here, if a width of gap area GA is less than 2 μm, a process defect such as a short circuit between the first and second electrodes E1 and E2 of each of the first and second transistors T1 and T2 may occur due to a patterning process margin of the first electrode E1. Also, if the width of gap area GA is greater than 4 μm, a pitch of each of the demulitplexing circuits 510 may become larger than that of a unit pixel, and thus, a size of the data distribution circuit may increase, which also may increase a size of a display panel.

In each of the plurality of demultiplexing circuits 510, the first and second electrodes E1 and E2 of each of two transistors T1 and T2 (or T2 and T3), which are adjacent to each other along the first horizontal axis direction X, of the first to third transistors T1 to T3 may directly face each other with the gap area GA therebetween and may be disposed in parallel in a non-rectilinear shape. As a result, a process margin for preventing a process defect such as a short circuit can be secured for the gap area GA between the two adjacent transistors T1 and T2 (or T2 and T3), and a size of each of the plurality of demultiplexing circuits 510 can be reduced, which can also decrease a size of the data distribution circuit 500.

Also, in each of the plurality of demultiplexing circuits 510, the first and second transistors T1 and T2 which are adjacent to each other along the first horizontal axis direction X may be disposed in parallel with the gap area GA therebetween, and the second and third transistors T2 and T3 adjacent to each other may be disposed in parallel with the gap area GA therebetween. As a result, the first and second transistors T1 and T2 which are disposed in parallel with the gap area GA therebetween may be defined as a first transistor group, and the second and third transistors T2 and T3 which are disposed in parallel with the gap area GA therebetween may be defined as a second transistor group.

In the first transistor group, the first electrode E1 of the first transistor T1 and the first electrode E1 of the second transistor T2 may directly face each other with the gap area GA therebetween and may be disposed in parallel in a non-rectilinear shape.

The first electrode E1 of the first transistor T1 may include a first edge portion E1b adjacent to the gap area GA, and the first edge portion E1b may have a wave cross-sectional shape. Also, the first electrode E1 of the second transistor T2 may include a first edge portion E1b adjacent to the gap area GA, and the first edge portion E1b may have a wave cross-sectional shape. The first edge portion E1b provided in the first electrode E1 of the first transistor T1 and the first edge portion E1b provided in the first electrode E1 of the second transistor T2 may directly face each other with the gap area GA therebetween and may be disposed in parallel, and may be alternately arranged along the second horizontal axis direction Y. As a result, the gap area GA may have a process margin for preventing a process defect such as a short circuit and may have a non-rectilinear shape along the second horizontal axis direction Y. Accordingly, the present embodiment can reduce a size of each of the plurality of demultiplexing circuits 510 as well as a size of the data distribution circuit 500.

Also, in the first transistor group, the second electrode E2 of the first transistor T1 and the second electrode E2 of the second transistor T2 may each include a second edge portion E2*b* having a wave cross-sectional shape. In this case, in each of the first and second transistors T1 and T2, the second edge portion E2*b* of the second electrode E2 may have a symmetric structure with the first edge portion E1*b* of the first electrode E1, with the gate electrode GE therebetween, or with the semiconductor layer SCL with respect to the first horizontal axis direction X as a center.

The first electrode E1 of each of the first and second transistors T1 and T2 including an edge portion having a wave cross-sectional shape may be electrically connected to a first area A1 of the semiconductor layer SCL through a plurality of first contact holes CH1 which are provided in the first edge portion E1*b* and are arranged at certain intervals. Likewise, the second electrode E2 of each of the first and second transistors T1 and T2 including an edge portion having a wave cross-sectional shape may be electrically connected to a second area A2 of the semiconductor layer SCL through a plurality of second contact holes CH2 which are provided in the second edge portion E2*b* and are arranged at certain intervals. Here, both edge portions of the semiconductor layer SCL of each of the first and second transistors T1 and T2 parallel to the second horizontal axis direction Y may be provided in the same shape as that of the first and second electrodes E1 and E2 of each of the first and second transistors T1 and T2.

In the first transistor group, the first electrode E1 of the first transistor T1 and the first electrode E1 of the second transistor T2 may each include a first main portion E1*a* and the first edge portion E1*b*.

The first main portion E1*a* may have a rectangular shape. Each of a plurality of first edge portions E1*b* may include a plurality of convex portions, which protrude from an end of the main portion E1*a* to have a curved shape or a polygonal shape, and a plurality of concave portions provided between the plurality of convex portions. Here, the polygonal shape may be a trapezoid shape or a saw-toothed shape in plane, and the curved shape may have a semicircular shape or a semielliptical shape.

The first electrodes E1 of the first and second transistors T1 and T2 may directly face each other with the gap area GA therebetween and may be disposed in parallel. Each of the plurality of convex portions provided in the first electrode E1 of the first transistor T1 and each of the plurality of convex portions provided in the first electrode E1 of the second transistor T2 may be alternately arranged along the second horizontal axis direction Y. As a result, the gap area GA may have a process margin for preventing a process defect such as a short circuit and may have the non-rectilinear shape along the second horizontal axis direction Y. Accordingly, a size of each of the plurality of demultiplexing circuits 510 can be reduced, which can also decrease a size of the data distribution circuit 500.

Also, in the first transistor group, the second electrodes E2 of the first and second transistors T1 and T2 may have a symmetric structure with the first electrode E1 with the gate electrode GE therebetween, or with the semiconductor layer SCL with respect to the first horizontal axis direction X as a center. As a result, the second electrode E2 of the first transistor T1 and the second electrode E2 of the second transistor T2 may each include a second main portion E2*a* and the second edge portion E2*b* which includes a plurality of convex portions and a plurality of concave portions.

The first electrode E1 of each of the first and second transistors T1 and T2 may be electrically connected to the first area A1 of the semiconductor layer SCL through a first contact hole CH1 provided in each of the plurality of convex portions. Likewise, the second electrode E1 of each of the first and second transistors T1 and T2 may be electrically connected to the second area A2 of the semiconductor layer SCL through a second contact hole CH1 provided in each of the plurality of convex portions. Here, both edge portions of the semiconductor layer SCL of each of the first and second transistors T1 and T2 parallel to the second horizontal axis direction Y may be provided in the same shape as that of the first and second electrodes E1 and E2 of each of the first and second transistors T1 and T2.

In the first transistor group, the first electrode E1 of the first transistor T1 and the first electrode E1 of the second transistor T2 may each include a plurality of first protrusion portions E1*p* and a plurality of first concave portions E1*c* which are each provided between two adjacent first protrusion portions E1*p* of the plurality of first protrusion portions E1*p*. Here, each of the plurality of first protrusion portions E1*p* may protrude to have a semicircular shape, a semielliptical shape, or a polygonal shape, and the polygonal shape may be a trapezoid shape or a saw-toothed shape in plane. Also, each of the plurality of first concave portions E1*c* may be concavely provided in the same shape as that of the first protrusion portions E1*p*.

As a result, each of the plurality of first protrusion portions E1*p* included in the first electrode E1 of one of the first and second transistors T1 and T2 may directly face a corresponding concave portion of the plurality of concave portions E1*c*, included in the first electrode E1 of the other transistor of the first and second transistors T1 and T2, with the gap area GA therebetween. For example, the first electrodes E1 of the first and second transistors T1 and T2 may directly face each other with the gap area GA therebetween and may be disposed in parallel, and each of the plurality of first protrusion portions E1*p* provided in the first electrode E1 of the first transistor T1 may be disposed to face a corresponding concave portion of the plurality of concave portions E1*c*, provided in the first electrode E1 of the second transistor T2. As a result, the gap area GA may have a process margin for preventing a process defect such as a short circuit and may have the non-rectilinear shape along the second horizontal axis direction Y. Accordingly, a size of each of the plurality of demultiplexing circuits 510 can be reduced, which can also decrease a size of the data distribution circuit 500.

In the first transistor group, the second electrode E2 of each of the first and second transistors T1 and T2 may have a symmetric structure with the first electrode E1 with the gate electrode GE therebetween, or with the semiconductor layer SCL with respect to the first horizontal axis direction X as a center. As a result, the second electrode E2 of the first transistor T1 and the second electrode E2 of the second transistor T2 may each include a plurality of second protrusion portions E2*p* and a plurality of second concave portions E2*c* which are each provided between two adjacent second protrusion portions E2*p* of the plurality of second protrusion portions E2*p*.

The first electrode E1 of each of the first and second transistors T1 and T2 including the plurality of protrusion portions may be electrically connected to the first area A1 of the semiconductor layer SCL through a first contact hole CH1 provided in each of the plurality of first protrusion portions E1$p$. Likewise, the second electrode E1 of each of the first and second transistors T1 and T2 including the plurality of protrusion portions may be electrically connected to the second area A2 of the semiconductor layer SCL through a second contact hole CH1 provided in each of the plurality of second protrusion portions E2$p$. Here, both edge portions of the semiconductor layer SCL of each of the first and second transistors T1 and T2 parallel to the second horizontal axis direction Y may be provided in the same shape as that of the first and second electrodes E1 and E2 of each of the first and second transistors T1 and T2.

In the second transistor group, the second electrode E2 of the second transistor T2 and the second electrode E2 of the third transistor T3 may directly face each other with the gap area GA therebetween and may be disposed in parallel in a non-rectilinear shape.

The third transistor T3 may have the same structure as that of the first transistor T1 and may be disposed in parallel with the first transistor T1 with the second transistor T2 therebetween. As a result, a gap area GA between the second transistor T2 and the third transistor T3 may be provided in the same shape as that of the gap area GA between the first transistor T1 and the second transistor T2, and thus, its repetitive description will be omitted.

The first electrode E1 of the third transistor T3 may directly face the second electrode E2 of the first transistor T1 of a next demultiplexing circuit 510 adjacent thereto in the first horizontal axis direction X with the gap area GA therebetween and may be disposed in parallel with the second electrode E2 of the first transistor T1 in a non-rectilinear shape. In this case, the first transistor T1 of the next demultiplexing circuit 510 may be disposed alternately with the first electrode E1 of the third transistor T3 along the second horizontal axis direction Y, and thus, the gap area GA may have a process margin for preventing a process defect such as a short circuit and may have the non-rectilinear shape along the second horizontal axis direction Y. Accordingly, a size of each of the plurality of demultiplexing circuits 510 can be reduced, which can also decrease a size of the data distribution circuit 500.

That is, the first transistor T1 of the next demultiplexing circuit 510 may be disposed on the same line as the second transistor T2 of a previous demultiplexing circuit 510 with respect to the first horizontal axis direction X, and thus, may be disposed alternately with the third transistor T3 of the previous demultiplexing circuit 510 along the second horizontal axis direction Y. As a result, a process margin for preventing a process defect such as a short circuit can be secured for the gap area GA between two demultiplexing circuits 510 which are adjacent to each other along the first horizontal axis direction X, and an interval between two adjacent demultiplexing circuits 510 can be reduced, which can further decrease a size of the data distribution circuit 500.

In a first transistor group of the next demultiplexing circuit 510, the second electrode E2 of the first transistor T1 and the second electrode E2 of the second transistor T2 may directly face each other with the gap area GA therebetween and may be disposed in parallel in a non-rectilinear shape.

In a second transistor group of the next demultiplexing circuit 510, the first electrode E1 of the second transistor T2 and the first electrode E1 of the third transistor T3 may directly face each other with the gap area GA therebetween and may be disposed in parallel in a non-rectilinear shape.

In the display device according to an embodiment of the present invention, the gap area GA provided between the plurality of transistors T1 to T3 included in each of the plurality of demultiplexing circuits 510 may have a process margin for preventing a process defect such as a short circuit and may have a non-rectilinear shape along the second horizontal axis direction Y. As a result, a size of each of the plurality of demultiplexing circuits 510 can be reduced, which can also decrease a size of the data distribution circuit 500. Accordingly, the data distribution circuit 500, which is applied to the display panel 100 having a high resolution, can be provided without substantially increasing a size of the display panel 100.

For example, in a 5.3 inches size display panel having a quad high definition (QHD) resolution of 2560×1440 or more, a pitch of one demultiplexing circuit 510 may be set to about 45.75 μm. In this case, if the gap area GA between the first to third transistors T1 to T3 is greater than 4 μm, one demultiplexing circuit 510 may not be provided within 45.75 μm which is set. On the other hand, in the present embodiment, the gap area GA between the first to third transistors T1 to T3 is provided in a non-rectilinear shape by modifying a shape of each of the first and second electrodes of the first to third transistors T1 to T3 included in each of the plurality of demultiplexing circuits 510, and thus, one demultiplexing circuit 510 can be implemented without substantially causing a defect such as a short circuit between transistors within 45.75 μm which is set.

Figure 10:
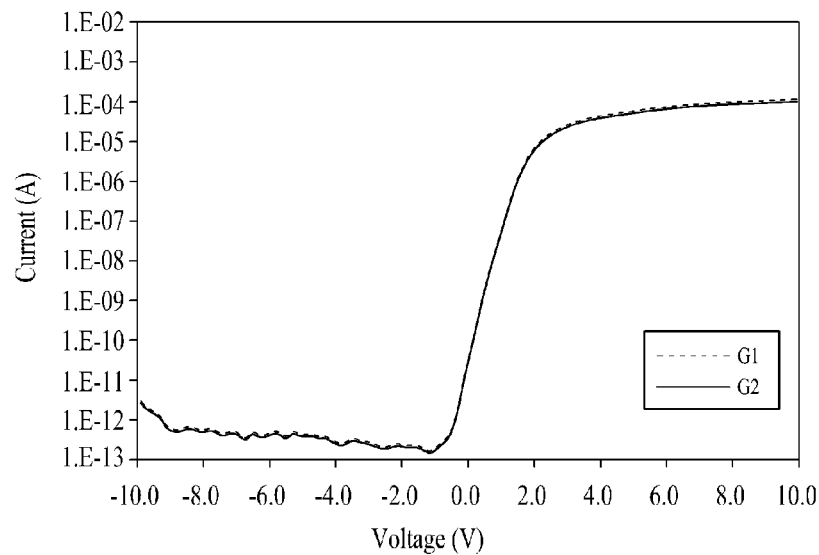
FIG. 10 is a graph showing a voltage-current characteristic of a transistor provided in a data distribution circuit according to an embodiment and a comparative example.

FIG. 10 is a graph showing a voltage-current characteristic of a transistor provided in a data distribution circuit according to an embodiment of the present invention and a comparative example.

FIG. 10 shows a result obtained by measuring a voltage-current characteristic of a transistor in a case where a gap area between transistors provided in a data distribution circuit has a non-rectilinear shape according to an embodiment of the present invention, and shows a result obtained by measuring a voltage-current characteristic of a transistor provided in a general data distribution circuit according to the comparative example. That is, the comparative example corresponds to a case where a gap area between transistors provided in the data distribution circuit has a non-rectilinear shape.

As shown in graph G1 of FIG. 10, it can be seen that the comparative example is similar to graph G2 according to the present embodiment. That is, in the present embodiment, with respect to the voltage-current characteristic of the transistor provided in the general data distribution circuit, a size of each of the plurality of demultiplexing circuits 510 can be reduced substantially without any degradation in the voltage-current characteristic of the transistor provided in the data distribution circuit, which thus can decrease a size of the data distribution circuit 500.

Figure 11:
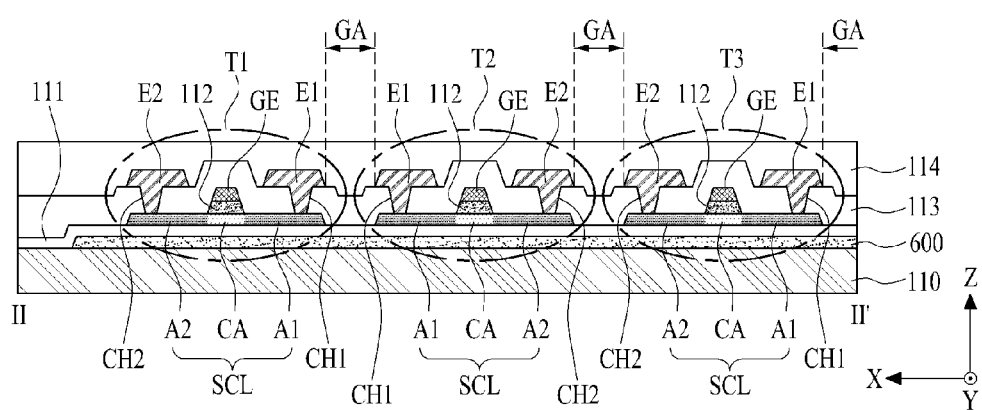
FIG. 11 is another cross-sectional view taken along line II-II' illustrated in FIG. 7.

In addition, as illustrated in FIG. 11, the display device according to an embodiment of the present invention may further include a light blocking layer 600, which is provided on the lower substrate 110 to overlap the data distribution circuit 500, and a power supply line which is electrically connected to the light blocking layer 600 to electrically ground the light blocking layer 600 or supply a DC voltage to the light blocking layer 600. The blocking layer 600 and the power supply line are the same as the light blocking layer and the power supply line illustrated in FIGS. 1 to 5, and thus, their repetitive descriptions will be omitted.

As described above, in the present embodiment, since the light blocking layer 600 which is electrically grounded or is supplied with a DC voltage is additionally provided under the data distribution circuit 500, light can be reduced or prevented from being irradiated onto the transistors T1 to T3 provided in the data distribution circuit 500. Moreover, the electrical characteristics of the transistors T1 to T3 can be reduced or prevented from being changed due to a parasitic capacitor caused by the light blocking layer 600, thereby decreasing a size of the data distribution circuit 500.

Figure 12:
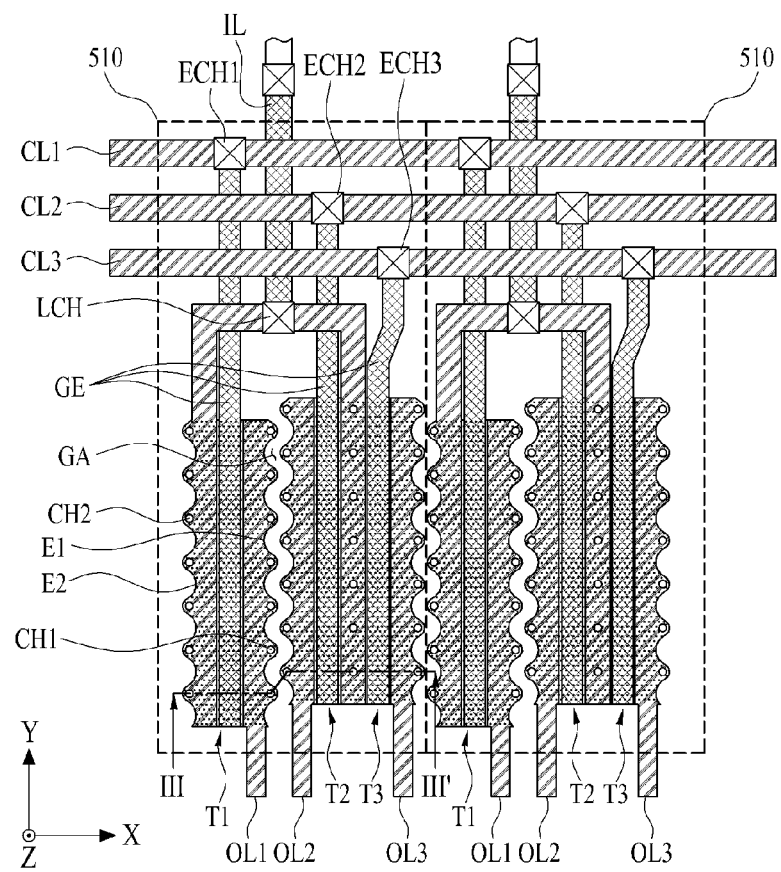
FIG. 12 is a diagram illustrating a portion of each of a plurality of demultiplexing circuits included in a data distribution circuit illustrated in FIG. 6.
Figure 13:
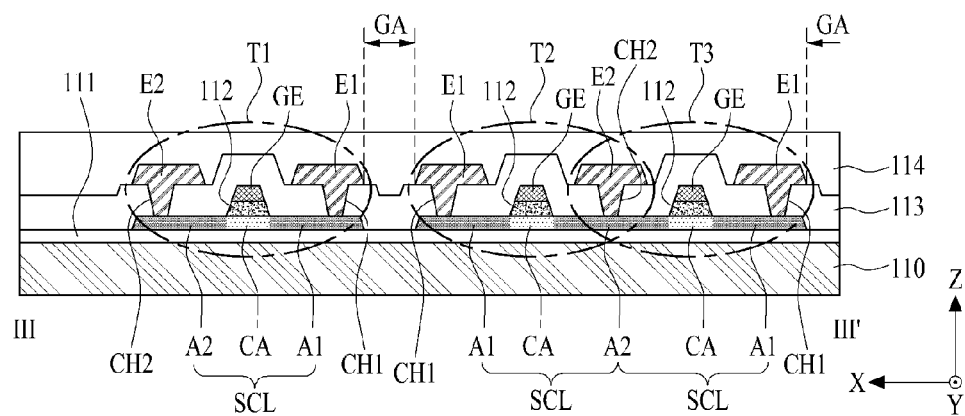
FIG. 13 is a cross-sectional view taken along line III-III' illustrated in FIG. 12.

FIG. 12 is a diagram illustrating a portion of each of a plurality of demultiplexing circuits included in a data distribution circuit illustrated in FIG. 6, and FIG. 13 is a cross-sectional view taken along line III-III' illustrated in FIG. 12. The data distribution circuit is implemented by modifying structures of some transistors of each of the plurality of demultiplexing circuits in the display device illustrated in FIGS. 6 to 9. Hereinafter, only a plurality of demultiplexing circuits and elements relevant thereto will thus be described.

Referring to FIGS. 12 and 13, a plurality of demultiplexing circuits 510 according to an embodiment may each include one input line IL, first to third output lines OL1 to OL3, and first to third transistors T1 to T3 which are connected to the input line IL in common and are connected to the first to third output lines OL1 to OL3 in a one-to-one relationship.

Each of the first to third transistors T1 to T3 may include a semiconductor layer SCL, a gate electrode GE, a first electrode E1, and a second electrode E2 as in the above-described embodiment. Hereinafter, a repetitive description on a configuration of each of the first to third transistors T1 to T3 will thus be omitted, and only structures of the first to third transistors T1 to T3 for decreasing a size of each of the demultiplexing circuits 510 will be described.

In the present embodiment, a gap area between the second and third transistors T2 and T3 may be removed by modifying a structure of each of the second third transistors T2 and T3 provided in each of the plurality of demultiplexing circuits 510, and thus, a size of each of the plurality of demultiplexing circuits 510 can be further reduced, which can also decrease a size of a data distribution circuit 500.

In detail, in each of the plurality of demultiplexing circuits 510, a gap area GA may be provided between two transistors T1 and T2, which are adjacent to each other along a first horizontal axis direction X, of the first to third transistors T1 to T3 and may have a non-rectilinear shape along a second horizontal axis direction Y identically to the above-described embodiment. Also, the third transistor T3 may be disposed in parallel with the second transistor T2 to share one of the first and second electrodes E1 and E2 of the second transistor T2.

For example, the first electrodes E1 of the first and second transistors T1 and T2, which are adjacent to each other along the first horizontal axis direction X, of the first to third transistors T1 to T3 may directly face each other with a gap area GA therebetween and may be disposed in parallel to have a non-rectilinear shape along the second horizontal axis direction Y. In this case, one (e.g., a source electrode) of the first and second electrodes E1 and E2 in each of the first to third transistors T1 to T3 may extend to the input line IL and may be connected to the input line IL through a line contact hole LCH in common, and the other electrode (e.g., a drain electrode) of the first and second electrodes E1 and E2 may be connected to the first and second output lines OL1 and OL2 in a one-to-one relationship. An arrangement structure of the first and second electrodes E1 and E2 adjacent to each other is the same as the above-described embodiment, and thus, its repetitive description will be omitted.

For example, the second and third transistors T2 and T3, which are adjacent to each other along the first horizontal axis direction X, of the first to third transistors T1 to T3 may be disposed in parallel to have the second electrode E2 without a gap area GA. That is, one second transistor T2 provided between a gate electrode GE of the second transistor T2 and a gate electrode GE of the third transistor T3 may be used as the second electrode E2 of each of the second and third transistors T2 and T3. In other words, the third transistor T3 may be disposed in parallel with the second transistor T2 to share the second electrode E2 of the second transistor T2.

One of the first and second electrodes E1 and E2 of the third transistor T3 may be connected to the input line IL through a line contact hole LCH in common, and the other electrode of the first and second electrodes E1 and E2 may be connected to the third output line OL3. In this case, the second electrode E2 of the second transistor T2 may be used as one electrode (i.e., the second electrode E2 of the third transistor T3), connected to the input line IL, of the first and second electrodes E1 and E2. The second electrode E2 of the second transistor T2 may be provided between the first electrode E1 of the second transistor T2 and the first electrode E1 of the third transistor T3, and thus, may not directly face the gap area GA. Accordingly, the same or similar to the above-described embodiment, the second electrode E2 of the second transistor T2 may not include any one of a wave cross-sectional shape, an edge portion including a plurality of convex portions, and a plurality of protrusion portions, and may have a rectangular shape in plane.

In addition, a semiconductor layers SCL of each of the second and third transistors T2 and T3 adjacent to each other may include a first area A1, a second area A2, and a channel area CA, and the second area A2 provided in the semiconductor layer SCL of the second transistor T2 may be used as the second area A2 provided in the semiconductor layer SCL of the third transistor T3 and may be electrically connected to the second electrode E2 of the second transistor T2 through a second contact hole CH2. That is, the second and third transistors T2 and T3 adjacent to each other may share the second area A2 of the semiconductor layer SCL.

In each of the plurality of demultiplexing circuits 510, the first electrode E1 of the third transistor T3 may directly face the second electrode E2 of the first transistor T1 of a next demultiplexing circuit 510 adjacent thereto in the first horizontal axis direction X with the gap area GA therebetween and may be disposed in parallel with the second electrode E2 of the first transistor T1 in a non-rectilinear shape. Since the first electrode E1 of the third transistor T3 directly faces the gap area GA, as described above, the first electrode E1 of the third transistor T3 may include one of a wave cross-sectional shape, an edge portion including a plurality of convex portions, and a plurality of protrusion portions.

As a result, the first electrode E1 of the third transistor T3 may be disposed alternately with the first transistor T1 of the next demultiplexing circuit 510 with the gap area GA therebetween along the second horizontal axis direction Y, and thus, the gap area GA may have a process margin for preventing a process defect such as a short circuit and may have a non-rectilinear shape along the second horizontal axis direction Y. Accordingly, a size of each of the plurality of demultiplexing circuits 510 can be reduced, which can also decrease a size of the data distribution circuit 500.

In the display device according to an embodiment of the present invention, a gap area between the second and third transistors T2 and T3 adjacent to each other in each of the plurality of demultiplexing circuits 510 may be removed, a gap area GA between the first and second transistors T1 and T2 adjacent to each other may be provided in a non-rectilinear shape, and a gap area GA between adjacent demultiplexing circuits 510 may be provided in a non-rectilinear shape. Accordingly, a size of each of the plurality of demultiplexing circuits 510 is further reduced, which can also decrease a size of the data distribution circuit 500.

Figure 14:
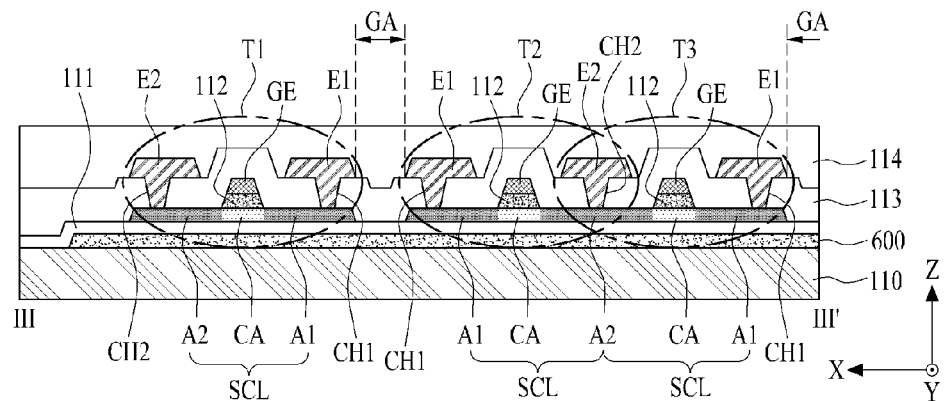
FIG. 14 is another cross-sectional view taken along line III-III' illustrated in FIG. 12.

In addition, as illustrated in FIG. 14, the display device according to an embodiment of the present invention may further include a light blocking layer 600, which is provided on the lower substrate 110 to overlap the data distribution circuit 500, and a power supply line which is electrically connected to the light blocking layer 600 to electrically ground the light blocking layer 600 or supply a DC voltage to the light blocking layer 600. The blocking layer 600 and the power supply line are the same as the light blocking layer and the power supply line illustrated in FIGS. 1 to 5, and thus, their detailed descriptions are not repeated.

As described above, in the present embodiment, since the light blocking layer 600 which is electrically grounded or is supplied with a DC voltage is additionally provided under the data distribution circuit 500, light can be reduced or prevented from being irradiated onto the transistors T1 to T3 provided in each of each demultiplexing circuit 510 of the data distribution circuit 500. Moreover, the electrical characteristics of the transistors T1 to T3 can be reduced or prevented from being changed due to a parasitic capacitor caused by the light blocking layer 600, thereby further decreasing a size of the data distribution circuit 500.

Figure 15:
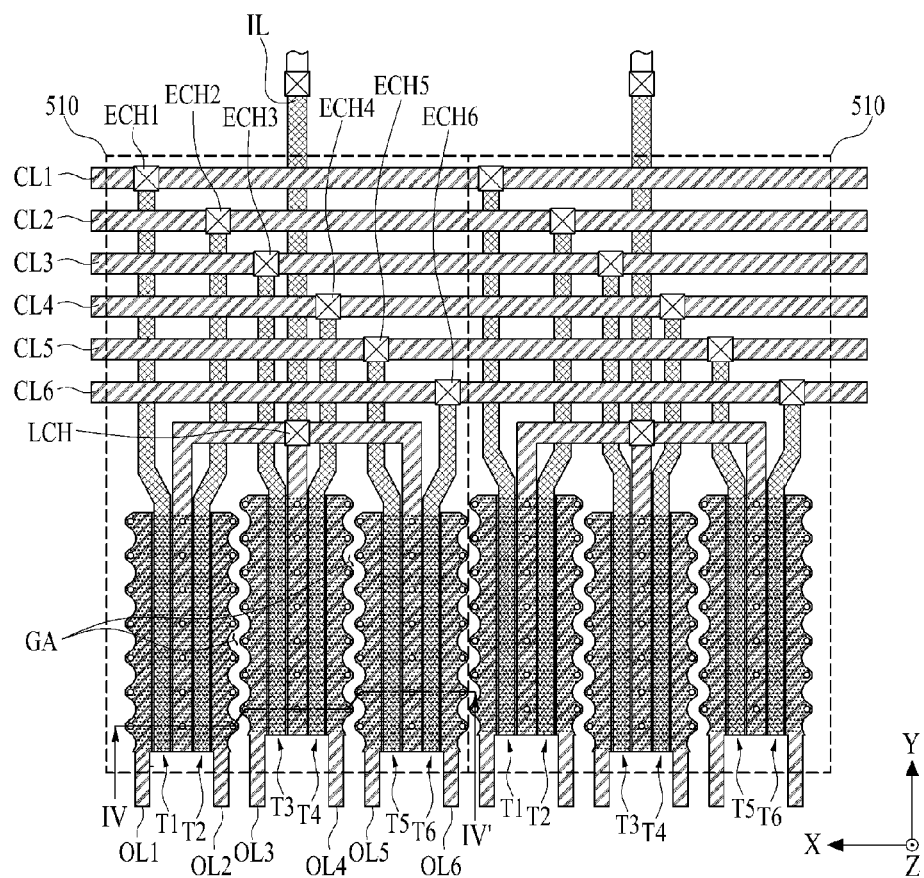
FIG. 15 is a diagram illustrating a portion of each of the plurality of demultiplexing circuits included in the data distribution circuit illustrated in FIG. 6.
Figure 16:
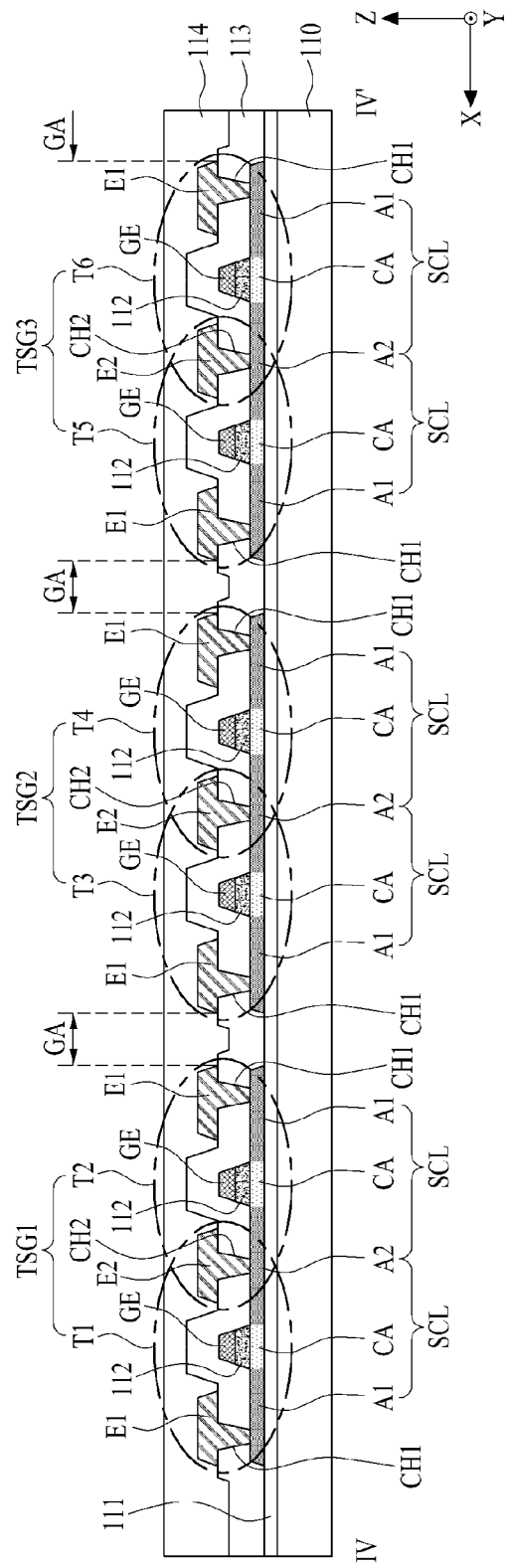
FIG. 16 is a cross-sectional view taken along line IV-IV' illustrated in FIG. 13.

FIG. 15 is a diagram illustrating a portion of each of the plurality of demultiplexing circuits included in the data distribution circuit illustrated in FIG. 6, and FIG. 16 is a cross-sectional view taken along line IV-IV' illustrated in FIG. 13. The data distribution circuit is implemented by modifying the number of transistors of each of the plurality of demultiplexing circuits in the display device illustrated in FIGS. 6 to 9. Hereinafter, only a plurality of demultiplexing circuits and elements relevant thereto will thus be described.

Referring to FIGS. 15 and 16, a plurality of demultiplexing circuits 510 according to an embodiment may each include one input line IL, first to sixth output lines OL1 to OL6, and first to sixth transistors T1 to T6 which are connected to the input line IL in common and are connected to the first to sixth output lines OL1 to OL6 in a one-to-one relationship.

Each of the first to sixth transistors T1 to T6 may include a semiconductor layer SCL, a gate electrode GE, a first electrode E1, and a second electrode E2 as in the above-described embodiment. Hereinafter, a repetitive description on a configuration of each of the first to sixth transistors T1 to T6 will thus be omitted, and only structures of the first to sixth transistors T1 to T6 for decreasing a size of each of the demultiplexing circuits 510 will be described.

In the present embodiment, the first to sixth transistors T1 to T6 provided in each of the plurality of demultiplexing circuits 510 may be divided into a plurality groups which each include two transistors of the first to sixth transistors T1 to T6, and a gap area between two transistors included in each of the plurality of groups may be removed. Accordingly, a size of each of the plurality of demultiplexing circuits 510 is further reduced, which can also decrease a size of a data distribution circuit 500.

The plurality of demultiplexing circuits 510 may each include first to third transistor sharing groups TSG1, TSG2, and TSG3 respectively including two transistors T1 and T2, two transistors T3 and T4, and two transistors T5 and T6, which are adjacent to each other along the first horizontal axis direction X.

Two adjacent transistor sharing groups TSG1 and TSG2 or TSG2 and TSG3 of the first to third transistor sharing groups TSG1, TSG2, and TSG3 may be disposed in parallel with a gap area GA, having a non-rectilinear shape along the second horizontal axis direction Y, therebetween. In this case, each of the first to third transistor sharing groups TSG1, TSG2, and TSG3 may include first and second transistors, and one of first and second electrodes of the first transistor may be used as one electrode, connected to an input line, of first and second electrodes of the second transistor. Also, a first electrode of a second transistor included in one of the two adjacent transistor sharing groups TSG1 and TSG2 or TSG2 and TSG3 and a first electrode of a first transistor included in the other transistor sharing group of the two adjacent transistor sharing groups TSG1 and TSG2 or TSG2 and TSG3 may directly face each other with a gap area GA therebetween and may be disposed in parallel in a non-rectilinear shape along the second horizontal axis direction Y.

The first transistor sharing group TSG1 according to an embodiment may include first and second transistors T1 and T2. In the first transistor T1, a gate electrode GE may be electrically connected to a first control line CL1 through a first electrode contact hole ECH1, one (e.g., a source electrode) of first and second electrodes E1 and E2 may extend to the input line IL and may be connected to the input line IL through a line contact hole LCH, and the other electrode (e.g., a drain electrode) of the first and second electrodes E1 and E2 may be connected to the first output line OL1. In the second transistor T2, a gate electrode GE may be electrically connected to a second control line CL2 through a second electrode contact hole ECH2, one (e.g., a source electrode) of first and second electrodes E1 and E2 may extend to the input line IL and may be connected to the input line IL through a line contact hole LCH, and the other electrode (e.g., a drain electrode) of the first and second electrodes E1 and E2 may be connected to the second output line OL2. The first and second transistors T1 and T2 may share a second area A2 of a semiconductor layer SCL. That is, a second area A2 provided in a semiconductor layer SCL of the first transistor T1 may be used as a second area A2 provided in a semiconductor layer SCL of the second transistor T2 and may be electrically connected to the second electrode E2 of the first transistor T1 through a second contact hole CH2.

The first and second transistors T1 and T2 of the first transistor sharing group TSG1 may be disposed in parallel without a gap area GA therebetween to share one (a second electrode E2) of first and second electrodes E1 and E2. That is, one second electrode E2 provided between a gate electrode GE of the first transistor T1 and a gate electrode GE of the second transistor T2 may be used as the second electrode E2 of each of the first and second transistors T1 and T2, and thus, may not directly face the gap area GA. Accordingly, the same or similar to the above-described embodiment, the one second electrode E2 may not include any one of a wave cross-sectional shape, an edge portion including a plurality of convex portions, and a plurality of protrusion portions, and may have a rectangular shape in plane. Also, the first electrodes E1 of the first and second transistors T1 and T2 may be connected to the first and second output lines OL1 and OL2 in a one-to-one relationship.

As a result, with respect to the first horizontal axis direction X, the first electrodes E1 of the first and second transistors T1 and T2 may be respectively disposed outside both sides of the first transistor sharing group TSG1 and may directly face a next or previous transistor sharing group with a gap area GA therebetween, and thus, the same or similar to the above-described embodiment, the first electrodes E1 may include one of a wave cross-sectional shape, an edge portion including a plurality of convex portions, and a plurality of protrusion portions.

The first and second transistors T1 and T2 of the first transistor sharing group TSG1 according to an embodiment may be disposed in parallel without a gap area GA therebetween to share one of the first and second electrodes E1 and E2, and thus, a size of each of the demultiplexing circuits 510 decreases by a size of a gap area GA provided between the first and second transistors T1 and T2.

The second transistor sharing group TSG2 according to an embodiment may include third and fourth transistors T3 and T4. In the third transistor T3, a gate electrode GE may be electrically connected to a third control line CL3 through a third electrode contact hole ECH3, one (e.g., a source electrode) of first and second electrodes E1 and E2 may extend to the input line IL and may be connected to the input line IL through a line contact hole LCH, and the other electrode (e.g., a drain electrode) of the first and second electrodes E1 and E2 may be connected to the third output line OL3. In the fourth transistor T4, a gate electrode GE may be electrically connected to a fourth control line CL4 through a fourth electrode contact hole ECH4, one (e.g., a source electrode) of first and second electrodes E1 and E2 may extend to the input line IL and may be connected to the input line IL through a line contact hole LCH, and the other electrode (e.g., a drain electrode) of the first and second electrodes E1 and E2 may be connected to the fourth output line OL4. The third and fourth transistors T3 and T4 may share a second area A2 of a semiconductor layer SCL. That is, a second area A2 provided in a semiconductor layer SCL of the third transistor T3 may be used as a second area A2 provided in a semiconductor layer SCL of the fourth transistor T4 and may be electrically connected to the second electrode E2 of the third transistor T3 through a second contact hole CH2.

The third and fourth transistors T3 and T4 of the second transistor sharing group TSG2 may be disposed in parallel without a gap area GA therebetween to share one (a second electrode E2) of first and second electrodes E1 and E2. That is, one second electrode E2 provided between a gate electrode GE of the third transistor T3 and a gate electrode GE of the fourth transistor T4 may be used as the second electrode E2 of each of the third and fourth transistors T3 and T4, and thus, may not directly face the gap area GA. Accordingly, the same or similar to the above-described embodiment, the one second electrode E2 may not include any one of a wave cross-sectional shape, an edge portion including a plurality of convex portions, and a plurality of protrusion portions, and may have a rectangular shape in plane. Also, the first electrodes E1 of the third and fourth transistors T3 and T4 may be connected to the third and fourth output lines OL3 and OL4 in a one-to-one relationship.

As a result, with respect to the first horizontal axis direction X, the first electrodes E1 of the third and fourth transistors T3 and T4 may be respectively disposed outside both sides of the second transistor sharing group TSG2 and may directly face a next or previous transistor sharing group with a gap area GA therebetween, and thus, the same or similar to the above-described embodiment, the first electrodes E1 may include one of a wave cross-sectional shape, an edge portion including a plurality of convex portions, and a plurality of protrusion portions.

The third and fourth transistors T3 and T4 of the second transistor sharing group TSG2 according to an embodiment may be disposed in parallel without a gap area GA therebetween to share one of the first and second electrodes E1 and E2, and thus, a size of each of the demultiplexing circuits 510 decreases by a size of a gap area GA provided between the third and fourth transistors T3 and T4.

The third transistor sharing group TSG3 according to an embodiment may include fifth and sixth transistors T5 and T6. In the fifth transistor T5, a gate electrode GE may be electrically connected to a fifth control line CL5 through a fifth electrode contact hole ECH5, one (e.g., a source electrode) of first and second electrodes E1 and E2 may extend to the input line IL and may be connected to the input line IL through a line contact hole LCH, and the other electrode (e.g., a drain electrode) of the first and second electrodes E1 and E2 may be connected to the fifth output line OL5. In the sixth transistor T6, a gate electrode GE may be electrically connected to a sixth control line CL6 through a sixth electrode contact hole ECH6, one (e.g., a source electrode) of first and second electrodes E1 and E2 may extend to the input line IL and may be connected to the input line IL through a line contact hole LCH, and the other electrode (e.g., a drain electrode) of the first and second electrodes E1 and E2 may be connected to the sixth output line OL6. The fifth and sixth transistors T5 and T6 may share a second area A2 of a semiconductor layer SCL. That is, a second area A2 provided in a semiconductor layer SCL of the fifth transistor T5 may be used as a second area A2 provided in a semiconductor layer SCL of the sixth transistor T6 and may be electrically connected to the second electrode E2 of the fifth transistor T5 through a second contact hole CH2.

The fifth and sixth transistors T5 and T6 of the third transistor sharing group TSG3 may be disposed in parallel without a gap area GA therebetween to share one (a second electrode E2) of first and second electrodes E1 and E2. That is, one second electrode E2 provided between a gate electrode GE of the fifth transistor T5 and a gate electrode GE of the sixth transistor T6 may be used as the second electrode E2 of each of the fifth and sixth transistors T5 and T6, and thus, may not directly face the gap area GA. Accordingly, the same or similar to the above-described embodiment, the one second electrode E2 may not include any one of a wave cross-sectional shape, an edge portion including a plurality of convex portions, and a plurality of protrusion portions, and may have a rectangular shape in plane. Also, the first electrodes E1 of the fifth and sixth transistors T5 and T6 may be connected to the fifth and sixth output lines OL5 and OL6 in a one-to-one relationship.

As a result, with respect to the first horizontal axis direction X, the first electrodes E1 of the fifth and sixth transistors T5 and T6 may be respectively disposed outside both sides of the third transistor sharing group TSG3 and may directly face a next or previous transistor sharing group with a gap area GA therebetween, and thus, the same or similar to the above-described embodiment, the first electrodes E1 may include one of a wave cross-sectional shape, an edge portion including a plurality of convex portions, and a plurality of protrusion portions.

The fifth and sixth transistors T5 and T6 of the third transistor sharing group TSG3 according to an embodiment may be disposed in parallel without a gap area GA therebetween to share one of the first and second electrodes E1 and E2, and thus, a size of each of the demultiplexing circuits 510 decreases by a size of a gap area GA provided between the fifth and sixth transistors T5 and T6.

Each of the plurality of demultiplexing circuits 510 according to an embodiment may further include a plurality of gap areas GA which are each provided two adjacent transistor sharing groups of the first to third transistor sharing groups TSG1, TSG2, and TSG3, and the gap areas GA may have a non-rectilinear shape along the second horizontal axis direction Y. Here, each of the gap areas GA having the non-rectilinear shape may be defined as a zigzag shape, a wave shape, or an S-shape along the second horizontal axis direction Y.

In detail, the first electrode E1 of the second transistor T2 provided in the first transistor sharing group TSG1 and the first electrode E1 of the third transistor T3 provided in the second transistor sharing group TSG2 may directly face each other with a gap area GA therebetween and may be disposed in parallel in a non-rectilinear shape. For example, a plurality of protrusion portions which are provided in the first electrode E1 of the second transistor T2 and are arranged at certain intervals and a plurality of protrusion portions which are provided in the first electrode E1 of the third transistor T3 and are arranged at certain intervals may be alternately disposed along the second horizontal axis direction Y, and thus, the gap area GA may have a process margin for preventing a process defect such as a short circuit and may have the non-rectilinear shape along the second horizontal axis direction Y. Accordingly, a size of each of the plurality of demultiplexing circuits 510 can be reduced, which can also decrease a size of the data distribution circuit 500.

Likewise, the first electrode E1 of the fourth transistor T4 provided in the second transistor sharing group TSG2 and the first electrode E1 of the fifth transistor T5 provided in the third transistor sharing group TSG3 may directly face each other with a gap area GA therebetween and may be disposed in parallel in a non-rectilinear shape. For example, a plurality of protrusion portions which are provided in the first electrode E1 of the fourth transistor T4 and are arranged at certain intervals and a plurality of protrusion portions which are provided in the first electrode E1 of the fifth transistor T5 and are arranged at certain intervals may be alternately disposed along the second horizontal axis direction Y, and thus, the gap area GA may have a process margin for preventing a process defect such as a short circuit and may have the non-rectilinear shape along the second horizontal axis direction Y. Accordingly, a size of each of the plurality of demultiplexing circuits 510 can be reduced, which can also decrease a size of the data distribution circuit 500.

In addition, the first electrode E1 of the sixth transistor T6 provided in the third transistor sharing group TSG3 and a first electrode E1 of a first transistor T1 provided in a first transistor sharing group TSG1 of a next demultiplexing circuit 510 may directly face each other with a gap area GA therebetween and may be disposed in parallel in a non-rectilinear shape. For example, a plurality of protrusion portions which are provided in the first electrode E1 of the sixth transistor T6 and are arranged at certain intervals and a plurality of protrusion portions which are provided in the first electrode E1 of the first transistor T1 of the next demultiplexing circuit 510 and are arranged at certain intervals may be alternately disposed along the second horizontal axis direction Y, and thus, a gap area GA between two adjacent demultiplexing circuits 510 may have a process margin for preventing a process defect such as a short circuit and may have the non-rectilinear shape along the second horizontal axis direction Y. As a result, in the present embodiment, a process margin for preventing a process defect such as a short circuit can be secured for a gap area GA between two demultiplexing circuits 510 which are adjacent to each other along the first horizontal axis direction X, and an interval between two adjacent demultiplexing circuits 510 can be reduced, which can further decrease a size of the data distribution circuit 500.

In the display device according to an embodiment of the present invention, a gap area between two adjacent transistors in each of the plurality of demultiplexing circuits 510 may be removed, a gap area GA between the transistor sharing groups TSG1, TSG2, and TSG3 which each include two adjacent transistors may be provided in a non-rectilinear shape, and a gap area GA between adjacent demultiplexing circuits 510 may be provided in a non-rectilinear shape. Accordingly, a size of each of the plurality of demultiplexing circuits 510 is further reduced, which can further decrease a size of the data distribution circuit 500.

In addition, as illustrated in FIG. 14, the display device according to an embodiment of the present invention may further include a light blocking layer 600, which is provided on the lower substrate 110 to overlap the data distribution circuit 500, and a power supply line which is electrically connected to the light blocking layer 600 to electrically ground the light blocking layer 600 or supply a DC voltage to the light blocking layer 600. The blocking layer 600 and the power supply line are the same as the light blocking layer and the power supply line illustrated in FIGS. 1 to 5, and thus, their detailed descriptions are not repeated.

As described above, in the present embodiment, since the light blocking layer 600 which is electrically grounded or is supplied with a DC voltage is additionally provided under the data distribution circuit 500, light can be reduced or prevented from being irradiated onto the transistors T1 to T3 provided in each of each demultiplexing circuit 510 of the data distribution circuit 500. Moreover, the electrical characteristic of the transistors T1 to T3 can be reduced or prevented from being changed due to a parasitic capacitor caused by the light blocking layer 600, thereby further decreasing a size of the data distribution circuit 500.

In the above-described embodiments, each of the plurality of demultiplexing circuits 510 has been described above as including three or six transistors, but the present invention is not limited thereto. In other embodiments, each of the plurality of demultiplexing circuits 510 may include, for example, transistors equal to a multiple of 3, a number of subpixels configuring a unit pixel or a half thereof.

In addition, in the above-described embodiment, the display panel 100 has been described above as a liquid crystal display panel including a liquid crystal layer, but the present invention is not limited thereto. In other embodiments, the display panel 100 may be an organic light emitting display panel including an organic light emitting device, and even in this case, the light blocking layer and the data distribution circuit may be identically or similarly applied to a TFT array substrate of the organic light emitting display panel.

As described above, according to the embodiments of the present application, the electrical characteristics of the data distribution circuit can be reduced or prevented from being changed by light incident on the data distribution circuit, and a size of each of the plurality of demultiplexing circuits can be reduced, which can also decrease a size of the data distribution circuit. Also, according to the embodiments of the present application, the data distribution circuit applied to a display panel having a high resolution can be provided without substantially increasing a size of the display panel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
a data distribution circuit including a plurality of demultiplexing circuits which each include one input line, first to nth (where n is a natural number equal to or more than two) output lines, and first to nth transistors connected to the one input line in common and respectively connected to the first to nth output lines;
a plurality of data lines respectively connected to the first to nth output lines of each of the plurality of demultiplexing circuits; and
a driving integrated circuit (IC) including a plurality of data output channels respectively connected to input lines of the plurality of demultiplexing circuits in a one-to-one relationship,
wherein
the plurality of demultiplexing circuits each comprise a gap area provided between two transistors, which are adjacent to each other along a first horizontal axis direction, of the first to nth transistors, and
the gap area has a non-rectilinear shape along a second horizontal axis direction.

2. The display device of claim 1, wherein the gap area has a zigzag shape along the second horizontal axis direction.

3. The display device of claim 1, wherein
the first to nth transistors each comprises:
a semiconductor layer including a first area, a second area, and a channel area between the first area and the second area;
a gate electrode overlapping the channel area of the semiconductor layer;
a first electrode connected to the first area of the semiconductor layer; and
a second electrode connected to the second area of the semiconductor layer, and
one electrode of the first electrode and the second electrode is connected to the one input line in common, and a remaining electrode of the first electrode and the second electrode is connected to the first to nth output lines in a one-to-one relationship.

4. The display device of claim 3, wherein first electrodes of the two adjacent transistors directly face each other with the gap area therebetween and are disposed in parallel to have a non-rectilinear shape along the second horizontal axis direction.

5. The display device of claim 4, wherein a first electrode of each of the two adjacent transistors comprises an edge portion adjacent to the gap area, the edge portion having a wave cross-sectional shape.

6. The display device of claim 4, wherein
the first electrode of each of the two adjacent transistors comprises a first protrusion portion and a first concave portion, and
the first protrusion portion included in the first electrode of one of the two adjacent transistors faces the first concave portion included in the first electrode of the other transistor of the two adjacent transistors.

7. The display device of claim 4, wherein
the n is three,
the two adjacent transistors are first and second transistors disposed in parallel with the gap area therebetween, and
the nth transistor is disposed in parallel with the second transistor to share a second electrode of the second transistor.

8. The display device of claim 7, wherein
one electrode of first and second electrodes of the nth transistor is connected to the one input line in common, and a remaining electrode of the first and second electrodes of the nth transistor is connected to the third output line, and
the second electrode of the second transistor is connected to the one electrode of the first and second electrodes of the nth transistor.

9. The display device of claim 6, wherein two demultiplexing circuits, which are adjacent to each other along the first horizontal axis direction, directly face each other with the gap area, having a non-rectilinear shape along the second horizontal axis direction, therebetween and are disposed in parallel.

10. The display device of claim 9, wherein
a second electrode of each of the two adjacent transistors comprises a second protrusion portion and a second concave portion, and
a second protrusion portion provided in a second electrode of one of two transistors, which directly face each other with the gap area, provided between the two adjacent demultiplexing circuits, therebetween and are disposed in parallel, faces a second concave portion provided in a second electrode of the other transistor of the two adjacent transistors.

11. The display device of claim 3, wherein
the plurality of demultiplexing circuits each comprise a plurality of transistor sharing groups each including two transistors of the first to nth transistors based on the first horizontal axis direction, and
two adjacent transistor sharing groups directly face each other with the gap area, having a non-rectilinear shape along the second horizontal axis direction, therebetween and are disposed in parallel.

12. The display device of claim 11, wherein
the plurality of transistor sharing groups each comprise first and second transistors, and
one electrode of first and second electrodes of the first transistor is connected to the one electrode of first and second electrodes of the second transistor.

13. The display device of claim 12, wherein a first electrode of a second transistor included in one transistor sharing group of the two adjacent transistor sharing groups and a first electrode of a first transistor included in the other transistor sharing group of the two adjacent transistor sharing groups directly face each other with the gap area therebetween and are disposed in parallel to have a non-rectilinear shape along the second horizontal axis direction.

14. A display device comprising:
a demultiplexing circuit including two or more transistors, the demultiplexing circuit distributing a data signal output from a driving integrated circuit (IC) to two or more data lines, and a gap area provided between the two or more transistors,
wherein
the two or more transistors each comprise a first electrode including a protrusion portion and a concave portion which are adjacent to the gap area, and a protrusion portion provided in one transistor of transistors adjacent to the gap area faces a concave portion provided in a remaining transistor of the transistors adjacent to the gap area.

15. The display device of one of claim 14, wherein a width of the gap area is 2 μm to 4 μm.

16. A display device comprising:
a data distribution circuit including a plurality of demultiplexing circuits which each include one input line, a plurality of output lines, and first to nth (where n is a natural number equal to or more than two) transistors connected to the one input line in common and respectively connected to the plurality of output lines;
a plurality of data lines respectively connected to the plurality of output lines of each of the plurality of demultiplexing circuits;
a driving integrated circuit (IC) including a plurality of data output channels respectively connected to input lines of the plurality of demultiplexing circuits in a one-to-one relationship;
a light blocking layer overlapping the data distribution circuit; and
a power supply line electrically connected to the light blocking layer.

17. The display device of claim 16, wherein the power supply line is a ground line or a direct current (DC) voltage line.

18. The display device of claim 17, wherein
the first to nth transistors each comprises:
a semiconductor layer including a first area, a second area, and a channel area between the first area and the second area;
a gate electrode overlapping the channel area of the semiconductor layer;
a first electrode connected to the first area of the semiconductor layer and connected to one line of the one input line and a corresponding output line; and
a second electrode connected to the second area of the semiconductor layer and connected to the other line of the one input line and the corresponding output line, and
the light blocking layer is disposed under the semiconductor layer.

19. The display device of claim 18, wherein the light blocking layer comprises a metal material or a semiconductor material.

20. The display device of one of claim 16, wherein
the plurality of demultiplexing circuits each comprises a gap area provided between two transistors, which are adjacent to each other along a first horizontal axis direction, of the first to nth transistors, and
the gap area has a non-rectilinear shape along a second horizontal axis direction.

21. The display device of claim 20, wherein the gap area has a zigzag shape along the second horizontal axis direction.

22. The display device of claim 21, wherein a width of the gap area is 2 μm to 4 μm with respect to the first horizontal axis direction.

23. The display device of claim 20, wherein
a first electrode of each of the two adjacent transistors comprises a plurality of protrusion portions, and
a plurality of protrusion portions included in a first electrode of one transistor of the two adjacent transistors and a plurality of protrusion portions included in a first electrode of a remaining transistor of the two adjacent transistors are alternately arranged along the second horizontal axis direction.

24. The display device of claim 23, wherein
the n is three,
the two adjacent transistors are first and second transistors disposed in parallel with the gap area therebetween, and
the nth transistor is disposed in parallel with the second transistor to share a second electrode of the second transistor.

25. The display device of claim 24, wherein
one electrode of first and second electrodes of the nth transistor is connected to the one input line in common, and the other electrode of the first and second electrodes of the nth transistor is connected to a third output line, and
the second electrode of the second transistor is connected to the one electrode of the first and second electrodes of the nth transistor.

* * * * *